United States Patent [19]

Cox, Jr. et al.

[11] 4,019,153
[45] Apr. 19, 1977

[54] DIGITAL PHASE-LOCKED LOOP FILTER

[75] Inventors: Duncan B. Cox, Jr., Manchester; William H. Lee, Boston, both of Mass.

[73] Assignee: The Charles Stark Draper Laboratory, Inc., Cambridge, Mass.

[22] Filed: Oct. 7, 1974

[21] Appl. No.: 512,733

[52] U.S. Cl. ............... 331/1 A; 328/133; 328/155; 329/104; 331/17; 331/25

[51] Int. Cl.² ............................ H03B 3/04

[58] Field of Search ............ 328/155, 133, 134; 307/232, 262; 331/1 A, 17, 25; 329/104

[56] References Cited

UNITED STATES PATENTS

| | | | |
|---|---|---|---|
| 3,544,717 | 12/1970 | Smith | 328/155 X |
| 3,781,695 | 12/1973 | Jackson | 328/155 |
| 3,883,817 | 5/1975 | Cliff | 331/1 A |

*Primary Examiner*—Siegfried H. Grimm
*Attorney, Agent, or Firm*—Robert F. O'Connell

[57] ABSTRACT

A phase processing system which includes at least one digital phase-locked loop wherein the phase of the input signal to the loop is compared with the phase of the loop output signal to produce a pulse-width modulated phase error signal. The error signal is digitally integrated, as by a counting means which cyclically counts the pulse widths thereof and provides a first control signal when the count reaches a first value and a second control signal when the count reaches a second value. The control signals are used to control the pulse rate of a clock signal to produce an intermediate clock signal such that when the first control signal is present a pulse is added thereto and when the second control signal is present a pulse is deleted therefrom. The intermediate clock signal is then fed to a feedback divider counting means which provides the loop output signal.

45 Claims, 21 Drawing Figures

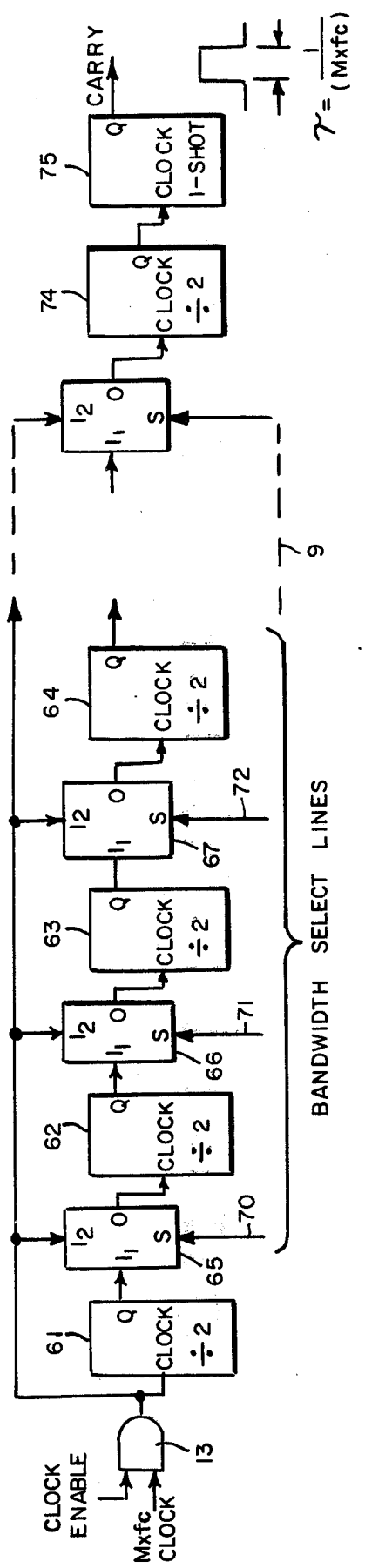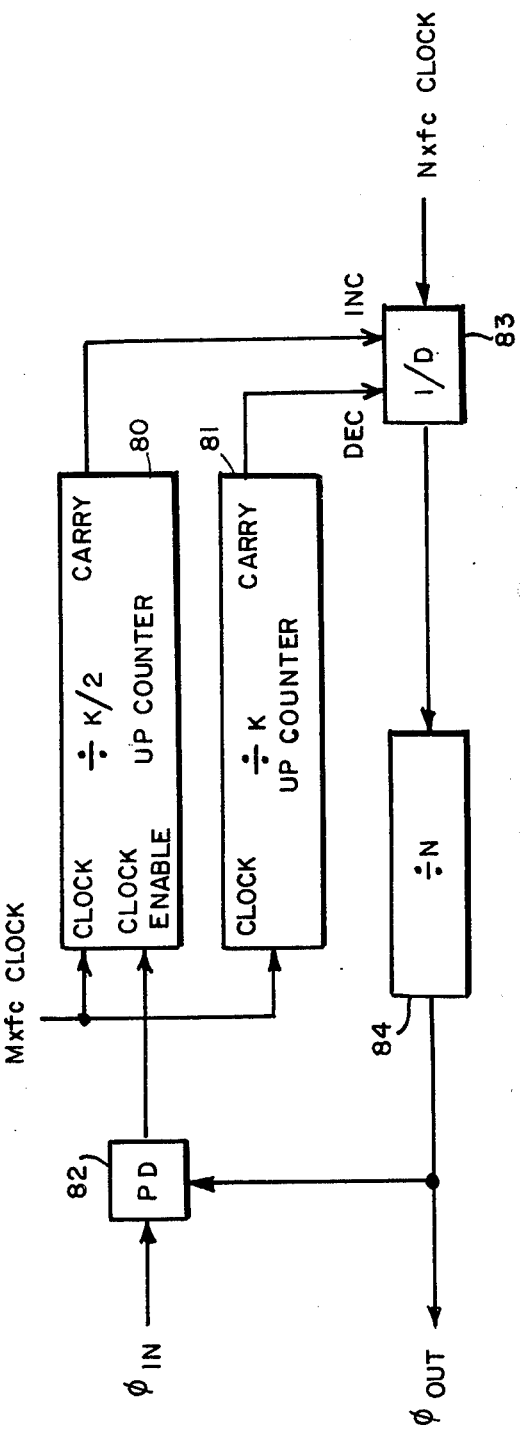

DIGITAL PHASE-LOCKED LOOP FILTER

INTRODUCTION

This invention relates generally to systems for processing the phase of signals and, more particularly, to phase locked loop systems using digital techniques for phase tracking or phase filtering of signals.

BACKGROUND OF THE INVENTION

Information is frequently transmitted by systems which modulate the phase or frequency of a carrier signal. This type of modulation is used both for signals transmitted over wires and for radio signals transmitted via electromagnetic radiation. A receiver of such signals frequently must perform a filtering operation on the transmitted signals to eliminate noise and signals not within the frequency band of the transmitted signal. When digital data is transmitted by means of well-known phase-shift keying (PSK) or frequency-shift keying (FSK) techniques, in addition to a filtering operation, the receiver system must also provide a conversion of the phase information to digital form.

Other applications in which the information is encoded on the phase of a signal include navigation systems, such as LORAN and OMEGA systems, and systems using angle readout transducers, such as resolvers and synchros (or selsyns) where the mechanical angle of a rotating shaft is converted to an electrical phase angle by the operation of the transducer. In such systems it is important that the phase angle of the signal be recovered very accurately. Also, in such applications there may be requirements for filtering and/or conversion of phase information to digital form.

Frequently, phase-decoding systems require very narrow bandwidths relative to the modulated frequency, and such narrow bandwidths are often difficult and expensive to obtain. Moreover, in applications where filtering is required, it would be advantageous if the bandwidth can be varied dynamically without detrimentally affecting the performance of the phase detection circuitry. Thus, in a navigation system such as LORAN or OMEGA, the received signal may have a varying signal-to-noise ratio (S/N) and in such cases it is desirable to have a relatively wide bandwidth so as to decrease the response time of the system when S/N is high and to have a relatively low bandwidth in order to achieve the desired accuracy when S/N is low. Further, in applications where it is important to accurately recover the phase of a signal as quickly as possible after the signal has been detected, phase errors due to the transient response of the phase-demodulation circuitry can be greatly reduced by dynamically changing the bandwidth in an optimal manner.

A system which can achieve the requirements mentioned above and which can be relatively easily adapted for different applications would prove to be a useful device. The value of such a system would be further enhanced if it could be relatively easily and inexpensively implemented in integrated circuit form.

DISCUSSION OF THE PRIOR ART

Present methods for accomplishing phase and frequency filtering and phase to digital conversion include the use of passive and active filter circuits, analog phase-locked loops, and computers for processing and filtering of phase information.

Passive and active filters provide filtering of a signal but do not provide any analog to digital conversion of the phase information. Moreover, such filters must be specifically designed for each application and their ability to achieve narrow bandwidths is very limited. They are extremely susceptible to environmental conditions, especially where high performance is required. Moreover, providing variable bandwidth capability is difficult and frequently results in a detrimental trade-off of other filter parameters.

Analog phase-locked loops provide analog to digital conversion of the phase information and can be designed to have varying bandwidths. However, their ability to achieve narrow bandwidths is limited by the error sources which are inherent in analog circuitry. Moreover, analog phase-locked loops are susceptible to environmental conditions so that their performance deteriorates as environmental requirements increase.

In applications which require very narrow bandwidth operation, a phase-locked loop is frequently simulated by means of computer processing techniques. While such processing can result in very good performance, the cost and size requirements make such a solution impractical for many applications.

Certain digital phase-locked loops have been suggested and are discussed in the following exemplary articles:

*International Telemetering Conference*, Oct. 10, 11, 12, 1972, sponsored by the International Foundation for Telemetering; "Session V, Digital Phase-Locked Loop", pages 89–149; McGregor & Werner, Washington, D.C."

"Optimal Space Communication Techniques, Section I, An All-Digital Phase-Locked Loop"; D. L. Schilling; NASA CR-132881; (City College of the City of New York) 1973.

"All Digital Phase-Lock Loops for Noise-Free Signals"; NASA Tech Brief B73-10350; August 1973.

"Frequency Control Circuit for All-Digital Phase-Lock Loops"; NASA Tech Brief B7-310351; August 1973.

"First-Order Discrete Phase Locked Loop with Application to Demodulation of Angle Modulated Carrier", *IEEE Transactions on Communication* in press, 1972.

"An All Digital Phase-Locked Loop for FM Demodulation", *Proc. of IEEE Conference on Communications*, June 1971.

U.S. Pat. No. 3,777,272, dated Dec. 4, 1973, "Digital Second-Order Phase-Locked Loop", Fletcher et al.

U.S. patent application Ser. No. 480,032, filed June 17, 1974, "Phase Processing Systems", D. Cox and W. Lee.

However, the systems described therein suffer from several disadvantages. Many of them, for example, use analog-to-digital (A/D) converters operating on the input to the loop or on a filtered output of the phase detectors of the loop. Such an approach requires more complicated circuitry to perform the phase processing and expensive A/D converters must be used therein. Many circuits convert the phase detector output to a binary value by using the aforementioned A/D conversion techniques, or counters, and then perform the phase processing through the use of digital, parallel-processing multipliers, dividers and registers, all of which make such systems complicated and expensive. Others of such systems use simple digital phase-tracking methods, but all such methods which might compare with the system of the invention in their simplicity suffer from the disadvantages of non-linear operation as opposed to the linear, true, phase-locked loop operation of this invention. The invention, as discussed below, takes advantage of the particular characteristics of phase processing to use counters, dividers, and simple gates to take the place of such prior used registers and parallel processors in order to create a linear, serial-processing phase filter of extreme simplicity. Furthermore, the system of the invention has the added advantages that the center frequency thereof is determined by the clock frequency and the modulus of the feedback counter and can be changed relatively quickly and simply. Moreover, the filtering parameters can be dynamically changed relatively easily to vary the bandwidth by digital inputs without introducing spurious responses into the loop. Further, first order modules can be appropriately connected extremely easily and relatively inexpensively to form higher order phase filtering systems of arbitrary order.

DESCRIPTION OF THE INVENTION

This invention comprises an improved digital phase-locked loop for processing an input signal to produce an output signal having a phase corresponding to the phase of the input signal. Moreover, the invention provides for a continuous conversion of phase information to parallel digital data form.

The operation parameters of the invention are determined by digital inputs which allow the same circuit to be used in many different applications merely by changing the digital inputs to the digital phase-locked loop. The parameters thereof can be dynamically changed by changing the digital inputs, without introducing errors into the circuit.

The invention can perform narrow-bandwidth phase tracking with higher phase resolution than conventional integrated-circuit analog phase-locked loops, the latter being limited in this respect due to the lack of frequency stability of integrated-circuit voltage controlled oscillators used therein. Moreover, the digital phase-locked loop can perform higher-Q filtering than is possible with analog phase-locked loops and which normally requires crystal or ceramic filters. The invention can achieve even higher-Q phase filtering in some applications than is possible with crystal filters if such higher-Q performance is needed.

The phase processing performed by the invention can be achieved more effectively than that performed by the digital phase-locked loop of our copending application in that the present system requires fewer components and is, therefore, less costly to manufacture and will tend to be more reliable in use. No clock frequency off-set is required and the overall transfer function of the invention is linear so that operation over a restricted region of the frequency deviation/phase error curve is not necessary. Moreover, the bandwidth of operation of the system of the invention can be easily varied dynamically, unlike our previously described system.

Further, the digital phase-locked loop of the invention can be fabricated as a single integrated circuit to provide a functional module that can perform better and is more easily utilized in many applications than conventional integrated circuit phase-locked loops presently being used. In order that the formation thereof on one integrated circuit be feasible and economically attractive, several requirements must be met. The circuit must be useful in many different applications; it, or a large part of it, must be capable of being put on a single monolithic chip; and its usefulness and wide application must not be diminished by the rigid constraint imposed by the availability of only a relatively small number of inputs and outputs. The digital phase-locked loop of the invention meets these requirements and is, therefore, readily adapted for integrated circuit fabrication.

The digital phase-locked loop of the invention can be extended to higher-order tracking loops by appropriately connecting several first-order digital phase-locked loop sections. Such higher-order loops can have complex and/or time-varying poles. Especially where an integrated circuit form thereof is used, higher-order filters made with the digital phase-locked loop of the invention are much simpler than other methods of higher-order digital filtering.

In accordance with a preferred embodiment of the invention, the phase of the input signal is compared with the phase of the output signal from a closed loop (described in more detail below) to produce a phase error signal which represents the difference between the phases of the input and output signals. The phase error signal is then digitally integrated at a preselected rate as, for example, in a suitable K-counter. In a preferred embodiment the digitally integrated signal provides no output so long as the phase error is zero. If, however, the phase-error is non-zero, the average state of the digital integrator over many cycles of the input signal changes, and one of two pulse control signals, the pulse rate thereof being proportional to the phase error, is provided at one of two outputs of the digital integrator depending on whether the phase error is positive or negative. The pulse control signal is then utilized to actuate and increment/decrement circuit which either adds or subtracts a controlled number of pulses from the pulsed output of a fixed reference oscillator which is fed thereto, depending on which of the two pulse control signals is generated, to produce an intermediate signal. The intermediate signal is fed to a feedback counter which produces the output signal, the phase of which depends on the controlled number of pulses which has been added or deleted from the reference pulse clock signal. The output signal thereby has a phase which effectively follows the phase of the input signal, so that the difference therebetween (i.e., the error signal) tends to become reduced to zero.

The invention, thus, uses all digital operation and, for that reason, is less sensitive to environmental changes than devices using analog operation, the digital system further imposing less stringent requirements on system supply voltages, shielding characteristics, temperature control, and the like. Moreover, the individual applications of the invention require negligible design time once the parameters of the system are determined. Thus, the bandwidth and center frequency of operation are determined solely by digital parameters and do not change with time, temperature, and the like.

Most importantly, extremely narrow bandwidth operation can be relatively easily achieved with a minimum of hardware so that the use thereof is especially practical where narrow bandwidth operation is desired. The only effective source of errors within the system (other than digital quantization errors), can be attributed to errors in the reference clock signal, which errors can be held to a minimum by the use of highly accurate crystal clock systems which are readily available to the art.

The use of such clock systems with this invention results in high performance not attainable with previously available methods of phase filtering or, alternately, performance similar to extant systems but at much lower cost.

The invention can be described in more detail with the help of accompanying drawings wherein FIG. 1 is a block diagram of a preferred embodiment of the invention;

FIG. 15 shows a block diagram of an embodiment of a portion of the invention for permitting changes to be made in the bandwidth thereof;

FIG. 16 shows a block diagram of an alternative embodiment of the invention;

Figure 1:
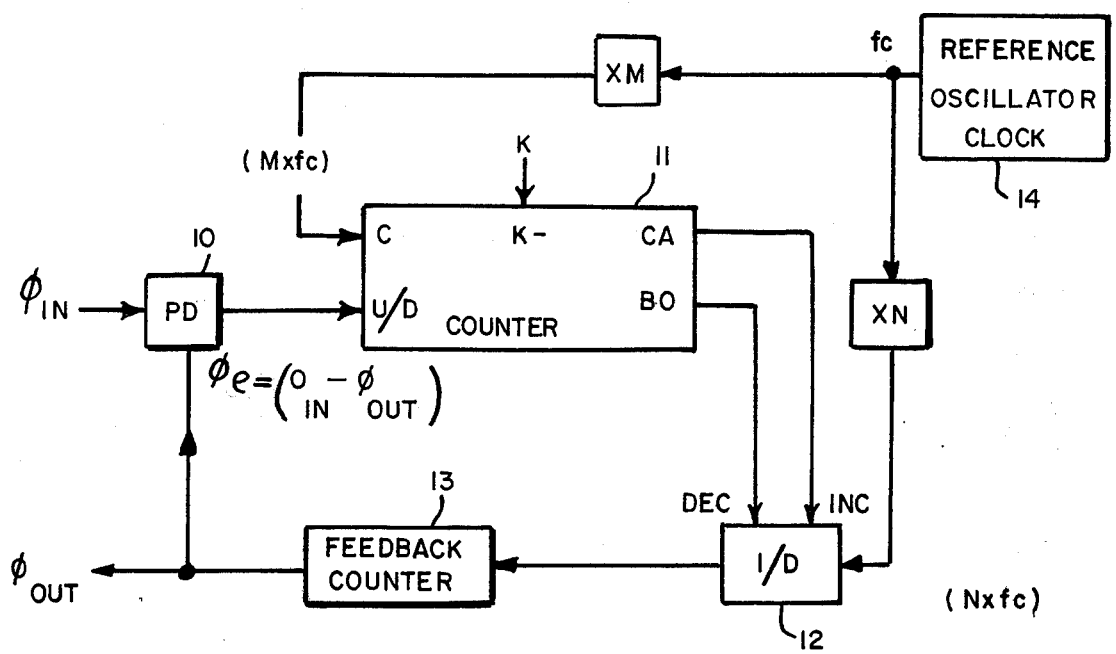
Figure 2:
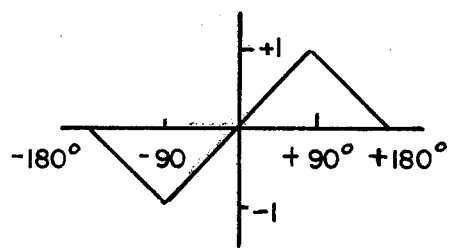
FIGS. 2 and 2A depict operating characteristic curves of the phase detector portion of the embodiment of FIG. 1.
Figure 2A:
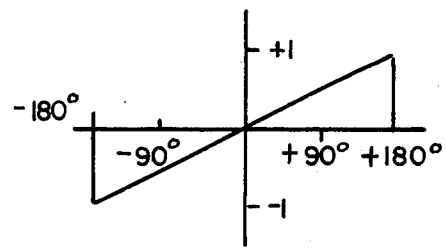

As can be seen in FIG. 1, a preferred embodiment of the invention includes a phase detector 10, a K-counter 11, an increment/decrement phase circuit 12, and a feedback counter 13 and a reference oscillator clock 14. The phase detector 10 can be any conventional digital phase detector, such as an exclusive-OR (XOR) or edge-triggered (ET) type, for example, both of which are well-known in the art, or any other suitable circuitry devised by the art for such purpose. In any case, the output of the phase detector is a pulse-width modulated signal whose average value is a linear function of the phase error, $\phi_e$, such phase error being defined as the difference between the phase $\phi_{IN}$ of the input signal and the phase $\phi_{OUT}$ of the output signal, i.e., ($\phi_{IN} - \phi_{OUT}$). The phase error versus output characteristics of the XOR and ET phase detector types are shown in FIGS. 2 and 2A, respectively. The phase detector output can be defined for convenience as having a value between −1 and +1. Thus, such output is −1 when the output waveform is low 100 percent of the time and is +1 when the output waveform is high 100 percent of the time. The phase detector output is zero when the output waveform is a square wave, i.e., the output waveform is low 50 percent of the time and is high 50 percent of the time. Accordingly, the output has intermediate values depending on the output waveform.

The phase detector gain ($K_D$) can be expressed in terms of output per cycle of phase error. For an XOR phase detector, for example, $K_D$ equals 4 since the phase detector output is −1 for a phase error of one-fourth cycle. For an ET phase detector, $K_D$ equals 2. Other phase detectors which may be used by those in the art may have different gains.

The output of phase detector 10 is fed to the K-counter 11. The K-counter performs a digital integration of the phase detector output at a rate set by the K-counter clock, which in the embodiment shown is M times the center frequency ($f_C$) of the loop. While the K-counter can be implemented in many different ways, one implementation thereof can be a well-known ÷ K up/down counter as shown in FIG. 1, where K is an integer the value of which is chosen as described below. The pulse control outputs of the up/down counter used herein correspond to the carry (CA) and borrow (BO) outputs thereof. When the K-counter recycles in the forward direction, that is, when the digital value in the K-counter (the K-counter "state") goes from K to zero, the carry output generates a control pulse one clock period in length. When the K-counter recycles in the reverse direction, that is, when the K-counter state goes from zero to K, the borrow output generates a control pulse one clock period in length.

Figure 13:
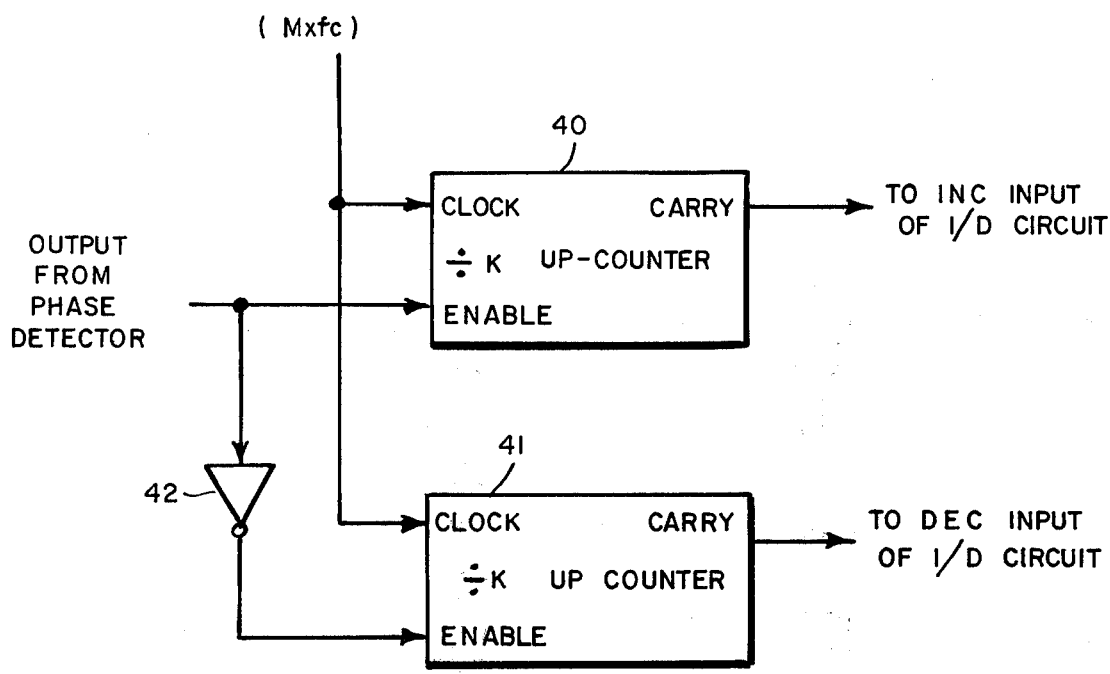
FIG. 13 shows a block diagram of an alternative embodiment of the K-counter shown in FIG. 1.

Another method of implementing the K-counter operation can make use of two ÷ K up-counters 40 and 41 connected as shown in FIG. 13. In this implementation a first up-counter 40 is enabled by the phase detector output waveform signal and counts up only when the phase detector output is high, and a second up-counter 41 is enabled by the inverted phase detector output (via inverter 42) and counts only when the phase detector output is low. The carry output of counter 40 enabled by the phase detector output corresponds to the carry output of the ÷ K up-down counter shown in FIG. 1 and the carry output of the counter 41 enabled by the inverted phase detector output corresponds to the borrow output of the ÷ K up-down counter of FIG. 1. Although, since both counters of FIG. 13 count only in the up direction, there will be more carry pulses out of counters 40 and 41 than carry and borrow pulses, respectively, out of a ÷ K up-down counter, the difference between the number of pulses to the DEC and to the INC inputs of the I/D circuit will be the same for both of the circuits of FIG. 1 and FIG. 13, and it is this difference in the number of "increment" and "decrement" pulses which is required to provide the desired circuit operation. One advantage of the implementation of FIG. 13 is that in instances where K is a non-integral power of 2, the ÷ K circuits are more easily realized and more available in integrated circuit form as up-counters instead of as up-down counters.

An alternate realization of the digital phase-locked loop of the invention is the embodiment shown in FIG. 16. Similarly to the embodiment previously described in FIG. 13, the K-counter is made up of two up-counters 80 and 81. In such embodiment the output of phase detector 82 enables and disables counter 80, which is a ÷ K/2 up-counter clocked by the clock signal of frequency (M$xf_C$), such that counter 80 counts when the phase detector output is high and does not count when the phase detector output is low. The carry output of counter 80 goes to the increment input of increment/decrement (I/D) circuit 83. The decrement input of I/D circuit 83 comes from the carry output of the ÷ K up-counter 81 which is continuously clocked by the same clock signal as counter 80 rather than being clocked only when the phase detector output is present as in FIG. 13. The I/D circuit 83 and feedback counter 84 operate as described before.

The circuit operation is similar to the embodiment implemented using the K-counter circuit of FIG. 13 which also uses two up-counters. The operation thereof depends on the fact that it is the difference in the number of INC and DEC pulses from the K-counters to the I/D circuit 83 that controls the phase change of the I/D circuit. This difference in the number of pulses is the same for the circuit of FIG. 16 as for the circuits described previously.

For example, when the loop is in lock with zero phase error with an input signal of frequency $f_C$, the phase detector output is a square wave, and counter 80 is enabled 50% of the time. Thus, the carry output of counter 80 is $$\frac{1}{2}\left(\frac{M \times f_C}{K/2}\right)$$

or M$xf_C$/K pulses per second (pps), and this output goes to the INC input of the I/D circuit. Counter 81 counts continuously, dividing the (M$xf_C$) clock by K, resulting in M$xf_C$/K carry pulses per second from counter 81 to the DEC input of I/D circuit 83. Thus the difference between the number of INC and DEC pulses is zero, as it should be, and $\phi_{OUT}$ remains in phase with $\phi_{IN}$.

If the phase detector output is all high, counter 80 counts 100 percent of the time. The number of carry pulses from counter 80 is (M$xf_C$) pps, divided by K/2, or 2(M$xf_C$)/K. Counter 81 sends M$xf_C$/K pps to the DEC input of the I/D circuit as described above, and the result is (M$xf_C$) more INC than DEC pulses per second to the I/D circuit. If the phase detector output is all low, counter 80 is disabled 100 percent of the time, and the input to the I/D circuit is (M$xf_C$) pps to the DEC input from counter 81 and zero pps to the INC input. For phase detector outputs between these extremes above, the difference in INC and DEC pulses to the I/D circuit varies linearly with the phase error.

Figure 17:
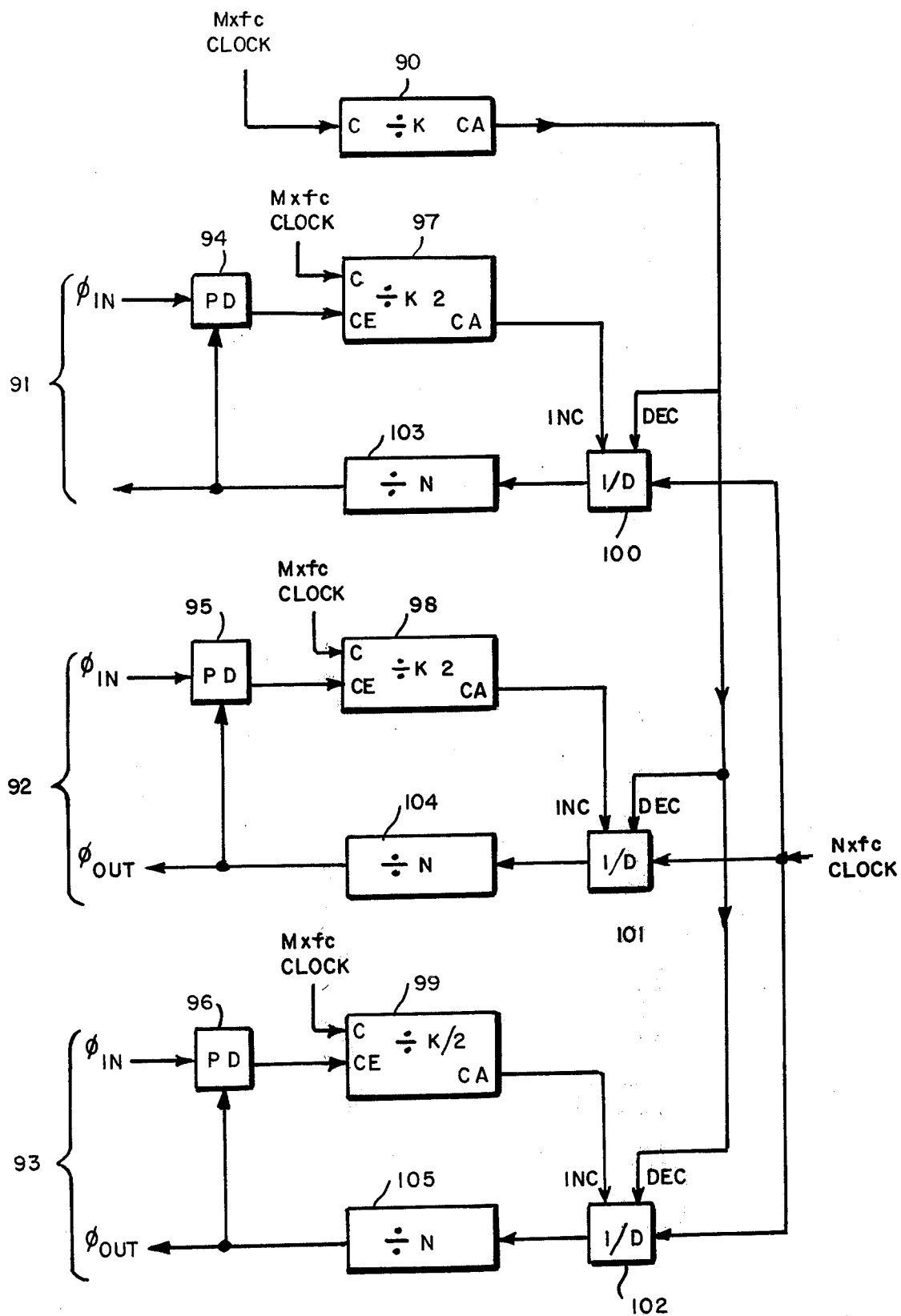
FIG. 17 shows an embodiment of the invention for performing a plurality of phase processing operations for different input signals.

The implementation shown in FIG. 16 may be useful, for example, in circumstances where several digital phase-locked loops, all with the same bandwidth, are tracking different input signals. Thus, as shown in FIG. 17, a single ÷ K up-counter 90 provides the necessary signals to the DEC inputs of the I/D circuits of several loops 91, 92 and 93 which loops are tracking different inputs and include, respectively, phase detectors 94, 95 and 96, ÷ K/2 up-counters 97, 98 and 99; I/D circuits 100, 101 and 102; and feedback counters 103, 104 and 105.

Figure 3:
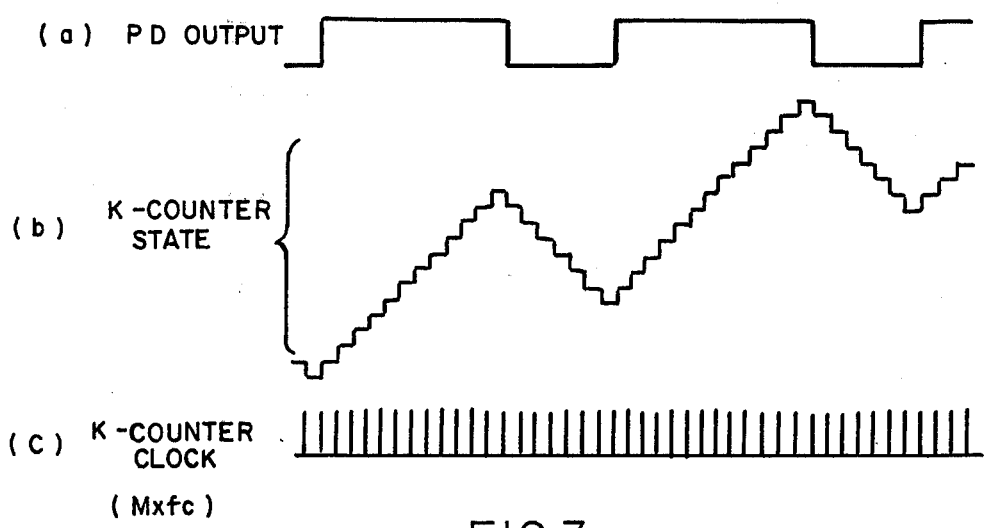
FIG. 3 shows operating waveforms helpful in understanding the operation of the K-counter of the embodiment of FIG. 1.

The K-counter circuitry counts appropriately in any of the forms discussed above in response to the phase detector output, counting up in FIG. 1, for example, when the latter output is high and counting down in FIG. 1 when the latter output is low, as shown in FIG. 3. The average state of the K-counter over several cycles of $f_C$ changes at a rate which is proportional to the phase error $\phi_e$. K is normally much larger than M so that even when the phase detector output is all high or all low, several cycles of $f_C$ will occur before the K-counter recycles.

The pulse control outputs, i.e., the carry and borrow outputs of the K-counter, are fed to the decrement (DEC) and increment (INC) inputs, respectively, of the increment/decrement phase circuit (I/D circuit) 12. Normally, the I/D circuit input clock signal (N$xf_C$) appears at the output thereof unchanged in frequency. However, if a pulse from the K-counter occurs on the decrement input, the I/D circuit deletes one clock pulse from the output thereof. If a pulse occurs on the increment input, a pulse is added to the output thereof.

Figure 4:
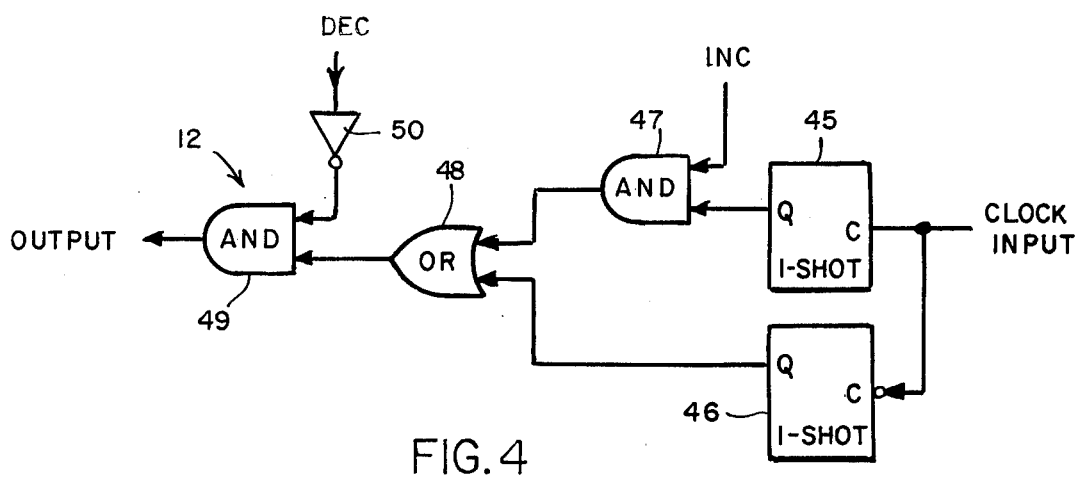
FIG. 4 shows a block diagram of an exemplary embodiment of the increment/decrement circuit of FIG. 1.

The I/D circuit may be implemented as shown in FIG. 4 wherein the square wave I/D circuit clock input goes to the clock inputs of a pair of one-shot monostable multivibrators 45 and 46. The latter circuits are connected so that multivibrator 45 produces a pulse at its output when triggered by the rising edge of the clock signal and multivibrator 46 produces a pulse at its output when triggered by the falling edge of the clock signal. The Q output of multivibrator 45 is fed to one input of AND circuit 47, the other input of which is the INC input from K-counter 11. The Q output of multivibrator 46 is fed to one input of OR circuit 48, the other input of which is from the output of AND circuit 47. The output of OR circuit 48 is in turn fed to one input of AND circuit 49, the other input of which is the inverted DEC input from K-counter 11, via inverter 50. The output of AND circuit 49 is supplied to feedback counter 13.

Figure 5:
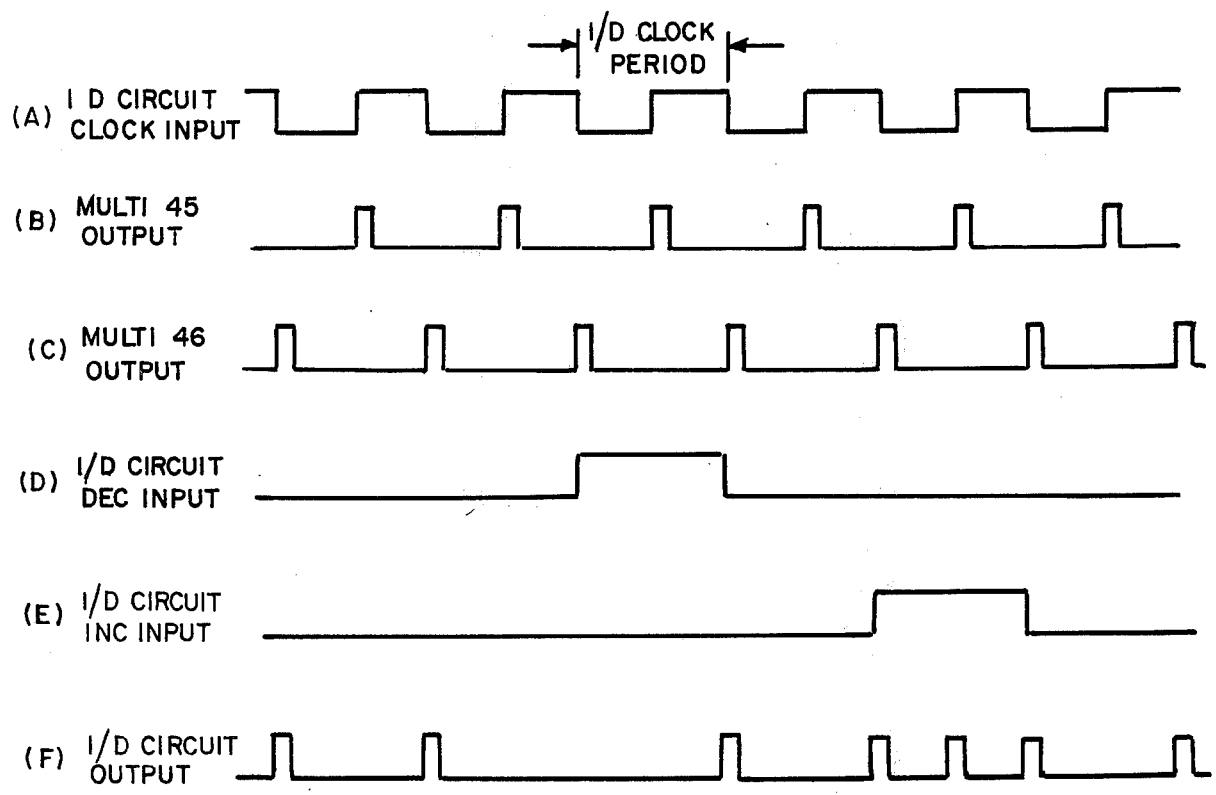
FIG. 5 shows operating wave forms helpful in understanding the operation of the increment/decrement circuit of FIG. 4.

The operation of multivibrators 45 and 46 is shown by waveforms (A), (B) and (C) of FIG. 5. If, for the purposes of explaining the operation thereof, it is assumed that the (M$xf_C$) clock signal to the K-counter is at the same frequency as the (N$xf_C$) clock to the I/D circuit (i.e., M=N), the increment and decrement (carry and borrow) pulses from the K-counter will be one I/D circuit clock-period long as shown in waveforms (D) and (E) of FIG. 5. Normally AND gate 47 is disabled by the normally-low INC signal and only the output of multivibrator 46 is transmitted by OR gate 48 to AND gate 49. Normally, AND gate 49 is enabled by the normally-low DEC signal as inverted by inverter 50 so that one pulse appears at the I/D output for each cycle of the I/D clock, as shown by waveform (F). If a borrow signal is generated by the K-counter, the DEC input shown by waveform (D) goes high for one clock period, disabling AND gate 49 and one pulse is deleted in waveform (F). If a carry signal is generated by the K-counter, the INC input shown by waveform (E) goes high for one clock period, thereby enabling AND gate 47 and one extra pulse from multivibrator 45 is added to the output by OR gate 48, as shown in waveform (F). Accordingly, the typical inputs shown in waveforms (A), (D) and (E) result in the output of waveform (F)

from the I/D circuit 12. Other ways of implementing the I/D circuit 12 will be readily apparent to those in the art within the spirit and scope of the invention.

The output of the I/D circuit is an intermediate clock signal which is supplied to a conventional $\div N$ counter, identified as the feedback counter 13, the most significant bit of the feedback counter (which must be a square wave for use with an exclusive OR phase detector) being fed to one input of phase detector 10, as in a conventional phase-locked loop.

Normally, when the loop is tracking a signal with a frequency $f_C$ with a zero phase error, the output of the phase detector 10 is a square wave, and the K-counter 11 counts up and down by equal amounts during the high and low outputs of each cycle of the phase detector output. Therefore, the average state of the K-counter does not change from cycle to cycle of $f_C$. Normally, when K is greater than M the K-counter does not recycle in either direction and the borrow and carry outputs remain inactive, i.e., the latter remain low. So long as both of these outputs are low, the pulses from the ($Nxf_C$) signal clock derived from clock 14 are fed through circuit 12 unchanged. The $Nxf_C$ signal is divided by N in the feedback counter 13 and the phase $\phi_{OUT}$ of the output signal therefrom has a frequency $f_C$ and such signal remains in phase with the phase $\phi_{IN}$ of the input signal.

If $\phi_{IN}$ is not in phase with $\phi_{OUT}$, the phase detector output will not be symmetrical and the average state of the K-counter over one cycle of $f_C$ will increase or decrease. Eventually, the K-counter will recycle in either the forward or reverse direction and a pulse will be produced on either the carry or borrow outputs thereof, depending on the sign of the phase error ($\phi_{IN} - \phi_{OUT}$). The I/D circuit 12 thereupon either adds or deletes a pulse in the intermediate clock signal being fed to the $\div N$ counter 13 which, accordingly, increments or decrements the phase of $\phi_{OUT}$ by 1/N cycles. Such operation continues until the phase error $\phi_e$ goes to zero, i.e., $\phi_{OUT}$ equals $\phi_{IN}$.

The bandwidth of the digital phase-locked loop in the invention can be determined in the following manner.

The phase error ($\phi_e$), i.e., the difference between the phases of the signals at the phase detector inputs, determines the rate at which the K-counter will count up or down. In general, for a given $\phi_e$ the K-counter will count both up and down as shown in FIG. 3. The circuitry of the invention is concerned with the change in the average state of the K-counter over many cycles. It is at this rate that the K-counter will count up or down over several cycles of the loop center frequency $f_C$. Each time the K-counter counts up or down by K, a carry or a borrow pulse is generated. If the carry pulses are defined as positive pulses and the borrow pulses as negative pulses, the pulse rate at the output of the K-counter ($K_{OUT}$) as a function of the phase error can be considered to have a positive or negative sign and, for an edge-trigger phase detector, is $$K_{OUT} = 2\phi_e \frac{M \times f_C}{K} \text{ (pulses/second)} \qquad (1)$$

where $\phi_e$ is measured in cycles. This is easily verified by noting that if $\phi_e$ is $\pm \frac{1}{2}$ cycle, the phase detector output is either all high or all low, and the number of pulses per second out of the K-counter carry or borrow outputs is the clock rate divided by the modulus K of the counter, as it should be.

Each time the I/D circuit 12 receives a carry or a borrow pulse from the K-counter it adds or deletes a pulse in the clock signal to the feedback counter, as described previously. This is equivalent to advancing or retarding the phase of the feedback counter by 1/N cycles with respect to a signal of frequency $f_C$. Thus, the change in the phase of the output signal, $\phi_{OUT}$, as a function of the INC and DEC pulses (denoted as positive and negative pulses) to the I/D circuit, can be expressed as $$\Delta \phi_{OUT} = 1/N \text{ (cycles/pulse)} \qquad (2)$$

Combining the above equations, one obtains the open-loop output of the loop as a phase rate (in cycles/second) as a function of the input phase error (in cycles).

$$\phi_{OUT} \text{ (cycles/second)} = \frac{2 \times M f_C}{K \times N} \times \phi_e \qquad (3)$$

The open-loop transfer function, or gain, of the digital phase-locked loop, $G_{OL}$, and, thus, the bandwidth thereof (since the bandwidth is equal to the gain) can be expressed as $$G_{OL} = \frac{\phi_{OUT} \text{ (cycles/second)}}{\phi_e \text{ (cycles)}} = \frac{2 \times M \times f_C}{K \times N} \frac{1}{\text{seconds}} \qquad (4)$$

The gain of the loop is in units of inverse seconds, or radians per second, even though the internal loop calculations are in units of cycles and cycles/second.

The factor of 2 in Eq. (4) arises from the gain ($K_D$) of the edge-triggered phase detector used in the calculations. We can express in general terms the bandwidth ($\omega_{3dB}$) of the digital phase-locked loop in FIG. 1 as $$\omega_{3dB} = \frac{K_D \times M \times f_C}{K \times N} \text{ rad/sec} \qquad (5)$$

An important parameter which is frequently more convenient in discussing the operation and characteristic of a digital phase-locked loop than the absolute bandwidth is the bandwidth of the loop relative to the center frequency of the loop. This parameter is similar to the Q-factor of conventional (i.e., non phase-tracking) band-pass filters, and can be referred to as the Q of a phase-locked loop. Since the Q of a filter is defined as the center frequency divided by the bandwidth, where the bandwidth is the double-sided bandwidth equal to twice the $\omega_{3dB}$ frequency expressed in the above equation, the Q of the digital phase locked loop can analogously be expressed as $$Q = \frac{\omega_C}{2 \times \omega_{3dB}} \qquad (6)$$

where $\omega_C$ is the loop center frequency $f_C$ in radians per second. If M is equal to N (as is usually the case in practice) and the above expression for $\omega_{3dB}$ is used, then the Q of a first order digital phase locked loop is $$Q = \frac{\omega_C}{2 \times \omega_{3dB}} = \frac{2 \times \pi \times f_C}{2 \frac{K_D \times f_C}{K}} = \frac{\pi \times K}{K_D} \quad (7)$$

For most applications, the K-counter clock and the I/D circuit clock can be the same so that M equals N and it is found that such operation maintains the peak error within an appropriate range for most applications.

If it is desired to change the bandwidth of the digital phase locked loop dynamically while the loop is tracking or acquiring a signal, the modulus K of the K-counter must be changed in a certain way to minimize errors. In order to minimize the amount of information which is lost and in order to prevent spurious responses from being introduced by the dynamic bandwidth variation, the modulus of the K-counter must be changed in such a manner that the information lost is that which is stored in the least significant bits of the counter and not the information in the most significant bits of the counter. For example, if the K-counter is a divide-by-$2^N$ up/down counter and the bandwidth is to be doubled by halving K, such halving of K should be achieved by eliminating the first stage of the counter, or the least significant bit, rather than by eliminating the last stage of the counter, or the most significant bit, to obtain a K of $2^{(N-1)}$.

If the K-counter is implemented by using two up-counters, as in the circuit shown in FIG. 13, one method of changing the K-counter modulus, by shortening the K-counter from the least significant bit end as described above, is illustrated by the up-counter circuitry of FIG. 15. In the specific example of FIG. 15, the modulus of the K-counter, and thus the bandwidth, is changed in steps of factors of 2; i.e., $K=2^N, 2^{N-1}, 2^{N-2}$, etc. Methods of varying K by other increments will be obvious to those in the art.

In FIG. 15 the up-counter includes a plurality of divide-by 2 counters 61, 62, 63 and 64, . . . etc. which are cascaded via 2-to-1 multiplexers 65, 66, 67, . . . etc. each having a pair of inputs $I_1$ and $I_2$, a select line input S and an output O, such that, when a select line is low, the input $I_1$ is connected to the output O. Each counter can be clocked by either the output of the preceding counter or by the ($Mxf_C$) clock. The bandwidth select lines are externally controlled and go to the select inputs of the multiplexers and select which of the two clock signals goes to the clock input of the following counter.

If all the bandwidth select inputs are low, counter 61 is clocked by the ($mxf_C$) clock, counter 62 is clocked by the output of counter 61, counter 63 is clocked by the output of counter 62, and so on. The output of the final counter 74 is fed to a one-shot multi-vibrator 75 which produces the output "carry" pulses. If one of the bandwidth select lines goes high the counter stages preceding the multiplexer are disconnected from the rest of the counter, thereby permitting the clock signal ($Mxf_C$) to be fed directly to the clock input of the succeeding stage, and the modulus by which the counter divides is effectively changed. Thus, if select line 70 goes high, the modulus of the counter is one-half of what it originally was; if select line 71 is high, the modulus is one-quarter of what it originally was; and so on. The clock enable signal (from the phase detector) gates the clock signal ($Mxf_C$) via AND gate 73 such that the counter only counts when the clock enable signal is high.

By using two counter circuits of the type shown in FIG. 15 as the up-counters in the K-counter implementation of FIG. 13, the K-counter modulus is changed in the desired manner as described above and the bandwidth of the digital phase-locked loop is dynamically changed without introducing spurious transients in the loop operation.

In a first-order analog phase locked loop with no ripple-cancellation filtering at the output of the phase detector, the desired resolution of the phase locked loop determines the highest bandwidth that can be realized consistent with that resolution, and vice versa. The bandwidth of the phase locked loop must be low enough so that the high or low output of the phase detector, when integrated by the voltage controlled oscillator over one-half of $f_C$ for an edge-triggered phase detector (or one-fourth cycle for an XOR phase detector), will result in less than one least significant bit phase shift in the feedback counter.

Figure 14:
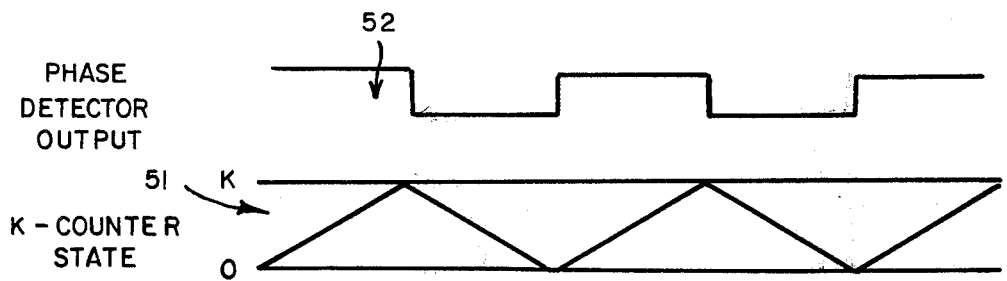
FIG. 14 shows waveforms helpful in understanding the problem of cyclical phase error, or ripple, in the invention.

There is a similar restriction in a digital phase locked loop. If a digital phase locked loop is tracking an input signal with zero phase error (i.e., the phase detector output is a square wave), in order for the K-counter not to cyclically decrement and increment the phase of the feedback counter 13 in accordance with the high and low states of the phase detector output, the values of K, and hence the loop bandwidth, should not be decreased below certain levels. If K is reduced below a certain level, the feedback counter would have a cyclical phase error, or ripple. This can be shown by the waveforms of FIG. 14 wherein the K-counter counts from zero to K and back to zero (as shown by K-counter state waveform 51) but never recycles as the phase detector output (as shown by waveform 52) changes. If K in FIG. 14 were reduced any further, however, the feedback counter would have a cyclical phase error, or ripple.

It can be shown that in order to avoid such a cyclical phase error, or ripple, the relationship between N and Q for either an exclusive OR phase detector or an edge-triggered phase detector must be selected in accordance with the following:

For an exclusive-OR phase detector, $$(16 / \pi) Q > N \quad (8)$$

For an edge-triggered phase detector, $$4/\pi \, Q > N \quad (9)$$

Figure 6:
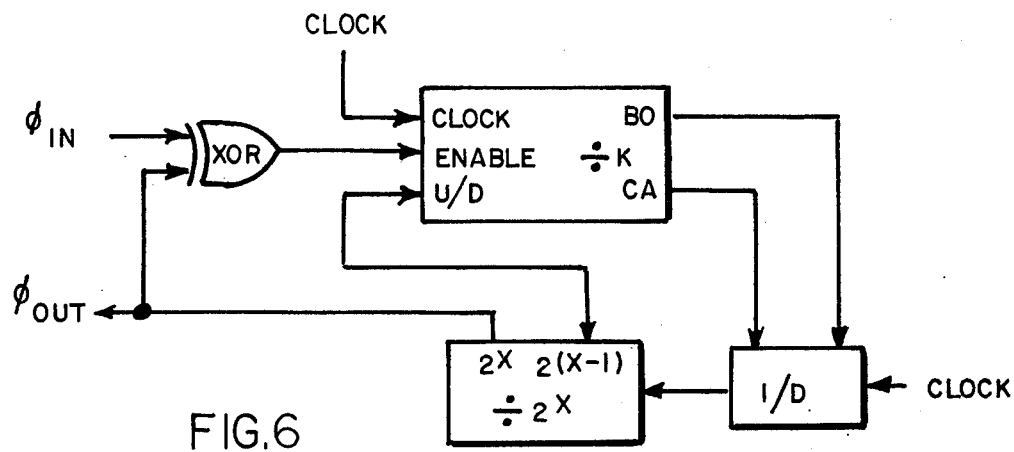
FIG. 6 shows a block diagram of the embodiment of FIG. 1 modified to provide for ripple cancellation when using an exclusive OR phase detector circuit.

FIG. 6 shows a configuration for connecting the phase detector and the K-counter which eliminates the ripple problem. The most significant bit of the feedback counter 13, i.e., $2^x$ (where $2^x=N$), goes to XOR phase detector together with $\phi_{IN}$, as usual, but instead of going to the K-counter U/D (up/down) input, the output of the phase detector goes to an enable input on the K-counter. The enable input prevents the K-counter from counting either up or down when the enable input is low. The second most significant bit of the feedback counter 13, i.e., $2^{x-1}$, goes to the K-counter U/D input. The K-counter counts up only when both the U/D input and the enable input are high, and the K-counter counts down only when the U/D input is low and the enable input is high.

Figure 7:
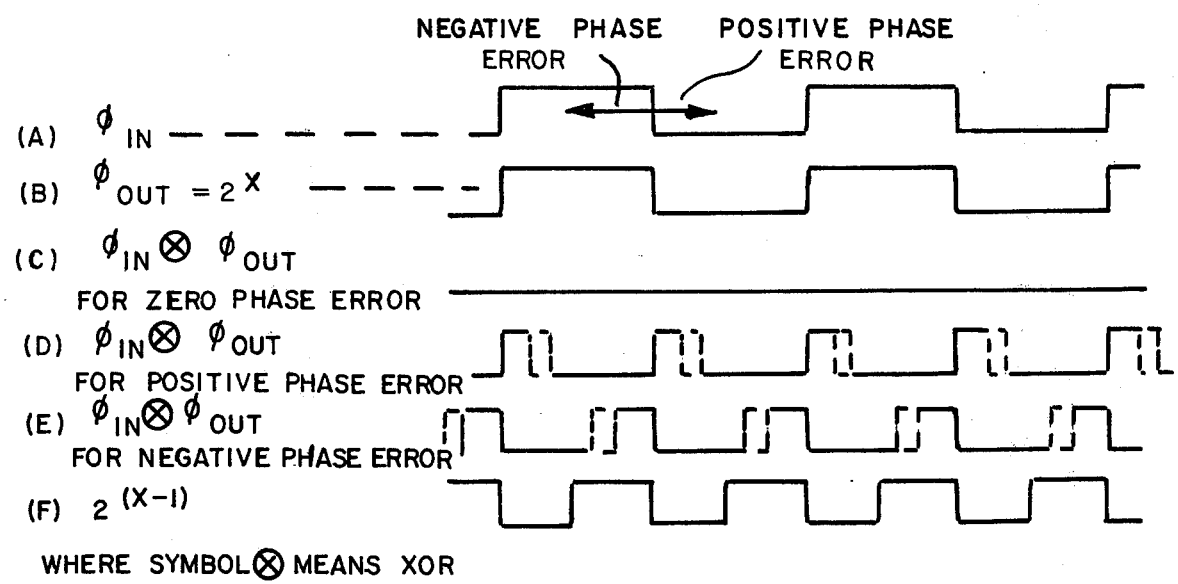
FIG. 7 depicts waveforms which are helpful in understanding the operation of the embodiment of FIG. 6.

The operation of the circuit of FIG. 6 can be best explained with reference to FIG. 7. Waveform (A) of FIG. 7 is the input phase waveform and waveform (B) is the phase detector output wave form when the phase error is zero. The zero phase error state of the ripple-cancellation circuit is when $\phi_{IN}$ and $\phi_{OUT}$ are in phase, rather than 90° out of phase as is usually the case with an XOR phase detector. Waveform (C) is the XOR waveform when the phase error is zero. If the phase of the input $\phi_{IN}$ changes in the positive directions, as defined in waveform (A) of FIG. 7, the XOR output will be a pulse whose width is proportional to the phase error, as shown in waveform (D). For a negative phase change in $\phi_{IN}$, the XOR output will be a pulse whose width is proportional to the phase error as shown in waveform (E). The important factor is that, for a positive phase error, the pulse of the exclusive-OR gate will extend in a positive time direction from the times coinciding with the rising and falling edges of $\phi_{OUT}$, while, for a negative phase error, the pulse output of the exclusive-OR gate will extend in a negative time direction from the times coinciding with the transitions of $\phi_{OUT}$, as shown in waveforms (D) and (E).

If the second most significant bit of the feedback counter 13 is connected to the U/D input of the K-counter, when the K-counter enable input is high due to a positive phase error, as in waveform (D), the U/D input will be low and the K-counter will count down. When the enable input of the K-counter is high due to a negative phase error, as in waveform (D), the U/D input will be high and the K-counter will count up. At all other times when the enable input is low, the K-counter will not count. The result is that, for phase errors of less than ± 90°, the K-counter will count only in the proper direction by an amount proportional to the phase error.

Figure 8:
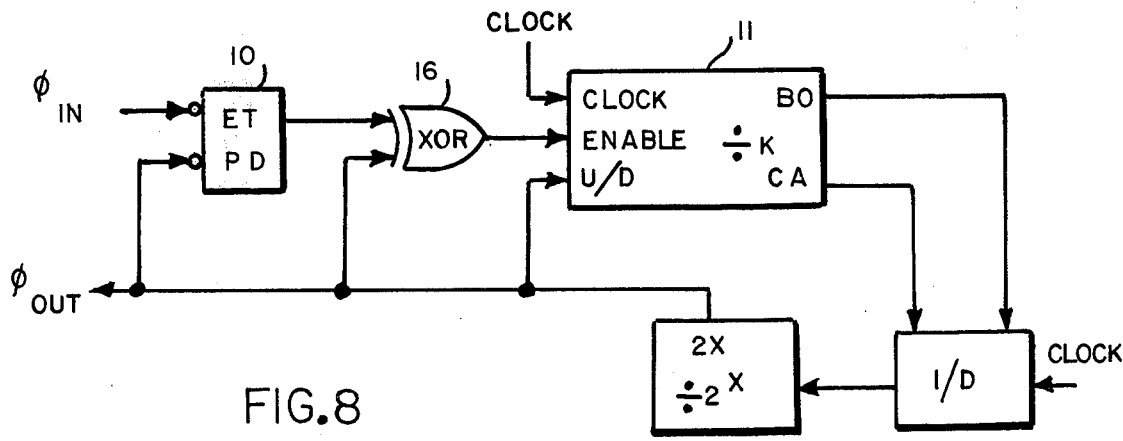
FIG. 8 shows a block diagram of the embodiment of FIG. 1 modified to provide for ripple cancellation when using an edge-triggered phase detector circuit.

The same type of circuit can be used to cancel ripple in a phase locked loop using an ET phase detector. FIG. 8 shows one implementation of such a circuit wherein the most significant bit, $2^x$, from feedback counter 13 is fed to the input of the edge-triggered phase detector 10, as usual, and is also fed to one input of an exclusive-OR circuit 16, the other input to which is the output of phase detector 10. Such most significant bit is fed to the U/D input of K-counter 11 while the output of exclusive-OR circuit 16 is fed to an enable input thereof.

The use of ripple cancellation technique in the digital phase locked loop of the invention imposes some restrictions on the overall circuitry. Ripple cancellation used with an edge-triggered phase detector, for example, requires that the most significant bit of the feedback counter be a square wave, as opposed to a BCD-coded output, for example. When used with an exclusive-OR phase detector, the most significant bit and the second most significant bit must both be square waves.

Figure 18:
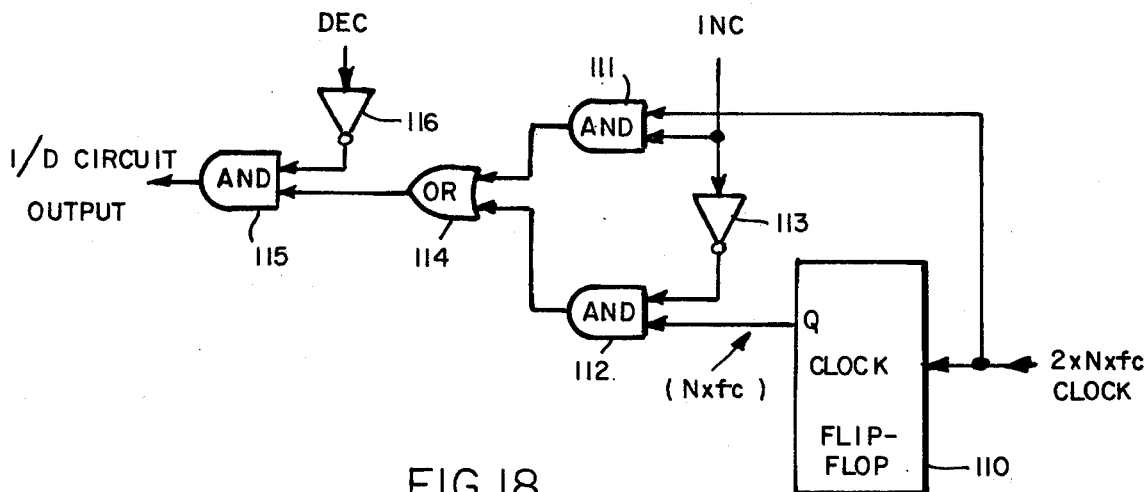
FIGS. 18 and 19 show an alternative embodiment of the increment/decrement circuit of FIG. 1 and the waveforms depicting the operation thereof.
Figure 19:
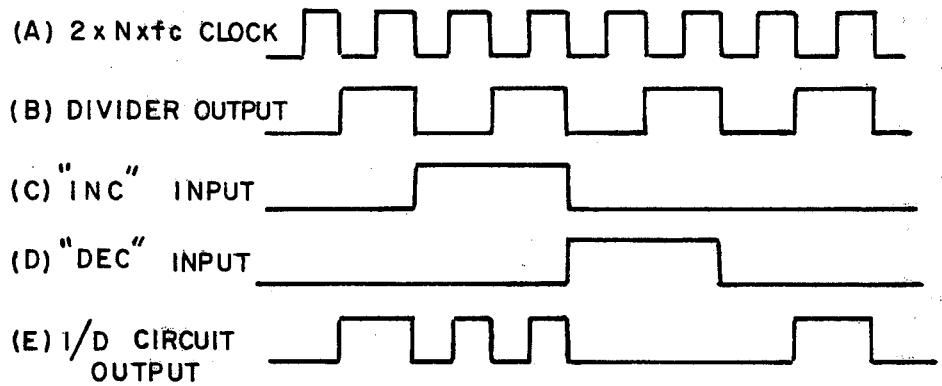

Another useful implementation of the I/D circuit is shown by the alternative embodiment of FIG. 18. The operation thereof can be explained with the use of the waveforms shown in FIG. 19. If, for the purposes of such explanation, it is assumed that M=N so that the (M$\times f_C$) clock signal to the K-counter is ½ the (2 × N$\times f_C$) clock input to the I/D circuit, the INC and DEC pulses from the K-counter will be two I/D clock periods long, as shown in waveforms C and D of FIG. 19. A clock signal of frequency (2 × N × $f_C$), as shown by waveform A of FIG. 19, where N is the modulus of the feedback counter and $f_C$ is the frequency of the input signal to the loop, clocks flip-flop circuit 110 which divides the (2 × N × $f_C$) clock frequency by 2, resulting in a square wave of frequency (N × $f_C$) at the output of the flip-flop, as shown by waveform B. The INC signal is normally low, disabling AND gate 111 and enabling AND gate 112 after being inverted by inverter 113. The (N × $f_C$) signal of the Q-output of flip-flop 110 goes through enabled AND gate 112, through OR gate 114, and then to the I/D circuit output via AND gate 115 which is enabled by the normally low DEC signal inverted by inverter 116. Thus, when both the INC and DEC inputs to the I/D circuit are low, the clock signal present at the output has a frequency of (N × $f_C$) as shown by wave forms, C, D and E of FIG. 19. If the K-counter generates an INC signal, the INC input to the I/D circuit will go high for two I/D circuit clock periods, thereby disabling AND gate 112 and enabling AND gate 111. During this time, the (2 × N × $f_C$) I/D circuit clock will be transmitted to the I/D circuit output via AND gate 111, OR gate 114, and AND gate 115, resulting in an extra clock signl going to the I/D circuit output, as shown by waveforms C and E of FIG. 19. If the K-counter generates a DEC signal, the DEC input to the I/D circuit will go high for two I/D circuit clock periods. During this time AND gate 115 is disabled and no clock signals are transmitted to the I/D circuit output, resulting in one less clock pulse going to the I/D circuit output, as shown by waveforms D and E in FIG. 19.

Figure 20:
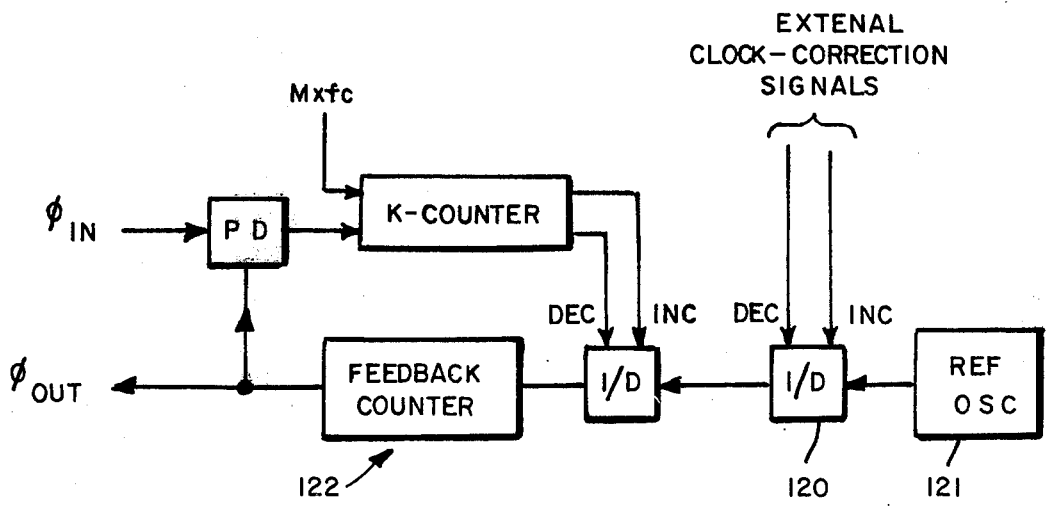
FIG. 20 shows an alternative embodiment of the invention of FIG. 1 for compensating for frequency changes in the input signal thereof.

In some cases, it will be desirable to shift slightly the clock frequency going to the I/D circuit, for example, to compensate for small changes in the frequency of the signal being tracked by the digital phase-locked loop. An example of such a change might be the Doppler shift of a signal being tracked by a digital phase-locked loop operating in an aircraft. Where information is available allowing such a frequency deviation to be known beforehand, this small frequency shift can be compensated for by adding or subtracting pulses from the clock signal to the I/D circuit. One method of doing this is shown in FIG. 20 where an additional I/D circuit 120 is used between the reference oscillator clock 121 and the I/D circuit within the digital phase-locked loop 122. I/D circuit 120 can correct the digital phase-locked loop center frequency by adding or subtracting pulses to the reference clock signal in response to appropriate external increment and decrement input signals.

The configuration of the digital phase-locked loop of the invention readily lends itself to fabrication in integrated circuit form which would then provide a functional module that would offer better performance and be more easily utilized than conventional phase-locked loops in integrated circuit form. A digital phase-locked loop on a single chip would serve as a simple building block for phase-processing systems and would make higher-order phase filtering, as discussed in more detail below, more attractive from the point of view of size, power and complexity.

In order that an integrated circuit digital phase-locked loop be reliably and economically produced, it must meet several requirements. First of all, it must be small enough in size and low enough in power consumption to be manufactured on a single chip. Secondly, the circuits design must be usable for a relatively wide variety of applications without the need for special modifications thereof for each application. Thirdly, the flexibility of the design should not be constrained by limitations on the number of pins, or terminals, available on the integrated circuit chip which limitations restrict an integrated circuit to a small number of inputs and outputs.

Figure 9:
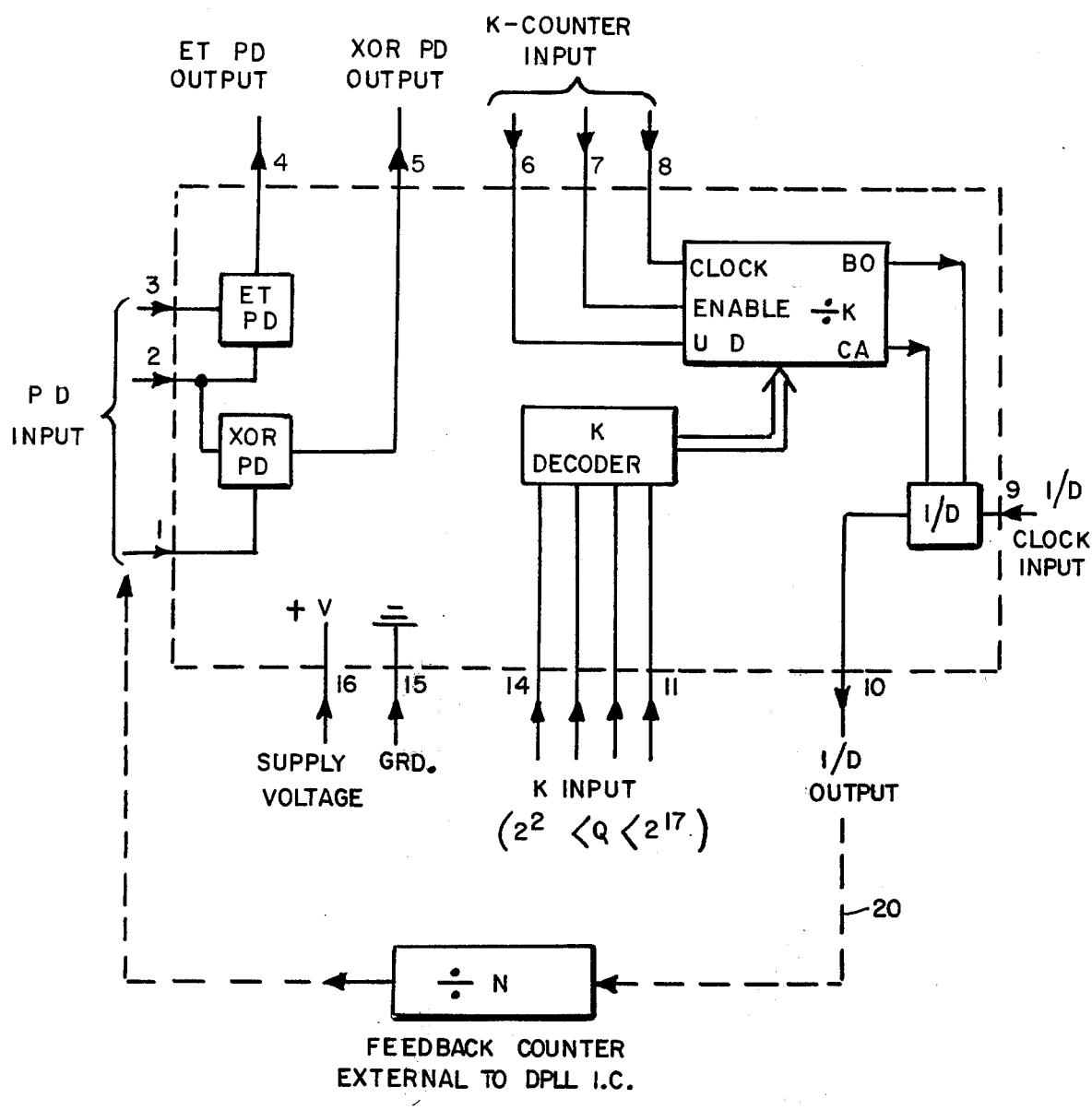
FIG. 9 shows a block diagram of the invention as partitioned for integrated circuit formation.

The digital phase-locked loop of the invention readily meets all these requirements and is, therefore, suitable for integration. FIG. 9 shows a block diagram in which one possible partitioning scheme for placing the digital phase-locked loop on an integrated circuit is depicted. In such scheme, all parts of the digital phase locked loop except for the feedback counter and the reference clock can be formed on one integrated circuit chip, as shown by dashed line 20. Feedback counters vary so widely in each application with respect to their size and coding (e.g., BCD, binary coding, etc.) that it would not seem practical to include the feedback counter on the chip. As shown in FIG. 9, the digital phase-locked loop can be put into a common 16-lead integrated circuit package without limiting its usefulness or performance. The configuration of FIG. 9 includes two phase detectors, one of the edge-triggered type and one of the exclusive-OR type. External pin connections allow either phase detector to be used alone or allow the edge-triggered phase detector to be used with the exclusive-OR gate in the ripple-cancellation circuit shown in FIG. 8, for example. The phase detector outputs and K-counter inputs are made available at appropriate pins and are not internally connected. In this way the circuit is flexible enough so that special applications which need access to these points can be accommodated. Examples of these applications might include cases in which exceptionally low bandwidths are required, which the integrated circuit could not achieve without the addition of extra counter stages, or applications in which noise suppression or bandwidth variation by K-counter blanking are needed.

The value K by which the K-counter divides is determined by four inputs to the K-decoder. Since the Q of the digital phase-locked loop is proportional to K, as shown in the above equation therefor, the four input code lines determining K allow 16 different values for K and Q to be selected, according to the binary number present on the four input lines. If, for example, K and Q are varied by a factor of 2 between steps, the integrated circuit digital phase-locked loop can realize Q's over a range of $2^{15}$. The digital phase locked loop integrated circuit shown in FIG. 9 can achieve Q's from 4 to 130,000, plus or minus a factor of 2, depending on the type of phase detector used. This selection of Q's and, hence, bandwidths should cover adequately the vast majority of applications.

Further, in those applications where Q's are required that are not available through the use of the integrated circuit alone, these value of Q can be achieved with the addition of minimal extra circuitry. The Q can be decreased by using a higher frequency for the $(M \times f_C)$ K-counter clock than for the $(N \times f_C)$ I/D-circuit clock. The Q can be increased by adding counter sections between the phase detector and K-counter inputs. Adding a programmable-divider integrated circuit between the phase detector and K-counter also allows Q to be varied in steps of arbitrary size, other than factors of 2. Periodically disabling the K-counter entirely for an integral number of cycles reduces the gain and bandwidth of the loop proportionally to the fraction of time that the K-counter is disabled. This can be used to increase the Q or to achieve smaller steps between values of Q.

The digital phase locked loop of the invention can be thought of as a serial digital filter, which allows digital filtering of low-frequency signals with a minimum of hardware. The configuration discussed above with reference to FIG. 1, for examle, represents the digital implementation of a one-pole or first-order filter. Such a first-order filter can be extended to a two-pole, or second-order filter, using the common building block proposed above for an integrated circuit as shown in FIG. 10.

Thus, a first digital phase-locked loop 20 includes phase detector 21, $K_1$-counter 22, increment/decrement circuit 23 and $\div N$ feedback counter 24, while a second digital phase-locked loop 25 includes phase detector 26, $K_2$-counter 27, increment/decrement circuit 28, and $\div N$ feedback counter 29. The clock input $(N \times f_C)$ is supplied to increment/decrement circuit 28, the output of which is supplied as the clock input of increment/decrement circuit 23. The same counter clock input $(M \times f_C)$ is supplied to K-counters 22 and 27. The output from feedback counter 24 of loop 20 is supplied as the input to the phase detector 26 of loop 25.

Figure 10:
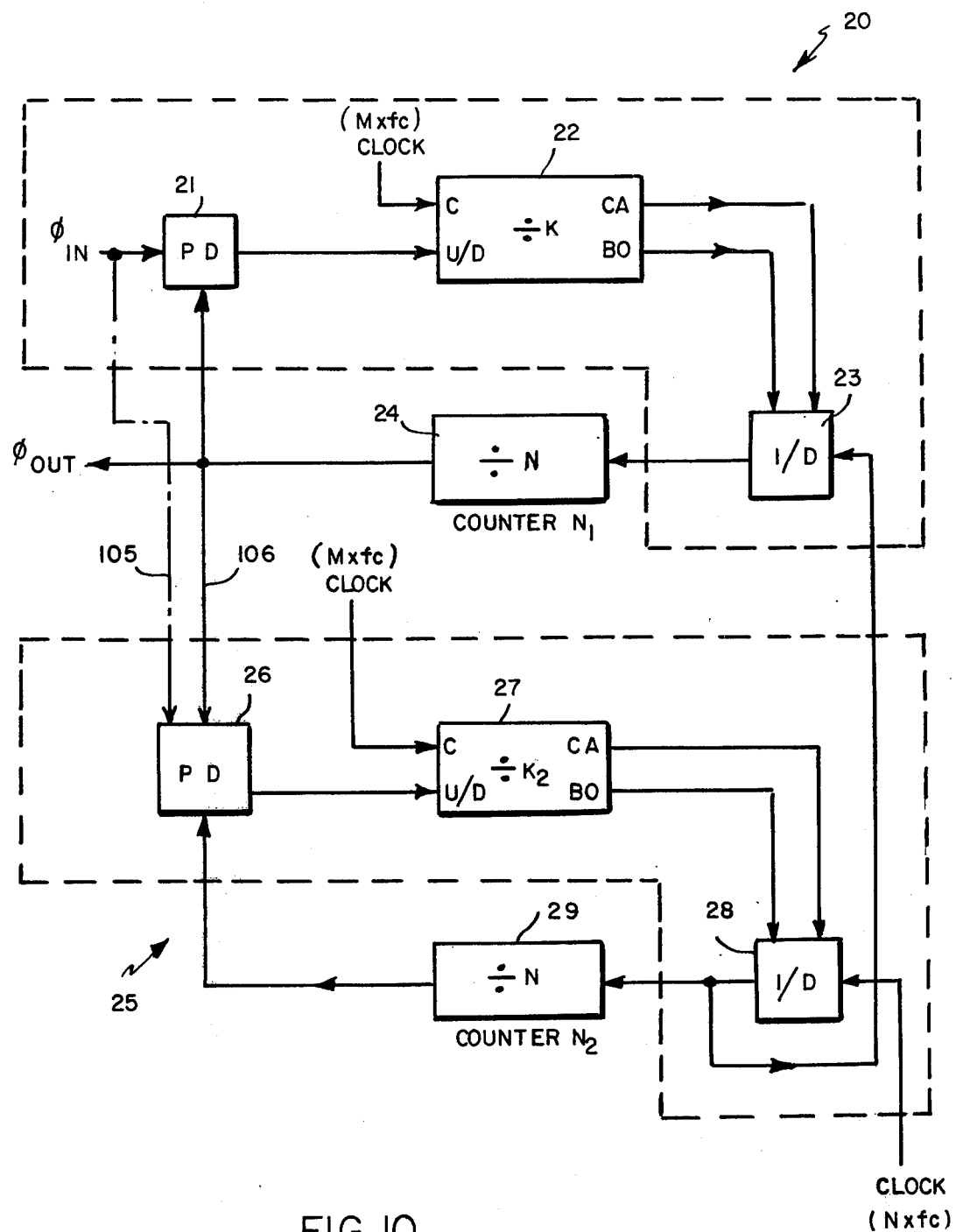
FIG. 10 shows a block diagram of the invention used in the form of a second-order filter.

To explain the operation of the second-order digital phase-locked loop of FIG. 10, it is assumed initially that $\phi_{IN}$ is a signal whose frequency is equal to the center frequency, $f_C$, of digital phase-locked loop 20. In such case, the loop is in lock so that $(\phi_{IN} - \phi_{OUT})$ is zero, counter $N_1$ is in phase with counter $N_2$, and the two inputs into the phase detector of digital phase-locked loop 25 are in phase. Then, the $K_2$-counter state does not change, the output of the I/D circuit of digital phase-locked loop 21 is the same as the input, i.e., $(N \times f_C)$, and this clock signal $(N \times f_C)$ is the clock for digital phase-locked loop 20.

If it is then assumed that a small frequency step is added to (or subtracted from) $\phi_{IN}$, an increasing phase error between $\phi_{IN}$ and $\phi_{OUT}$ results. This phase error is integrated by counter $K_1$ until, after a period of time determined by $K_1$ of digital phase-locked loop 20, a carry (or borrow) pulse is supplied to the I/D circuit 23. This pulse advances (or retards) the phase of N-counter 24 by 1/N cycles. Because of this, the inputs to the phase detector of digital phase-locked loop 25 are no longer in phase, and the phase error that results is integrated by $K_2$-counter 27 until a carry (or borrow) pulse is supplied to the I/D circuit 28 of digital phase-locked loop 25. This pulse will advance (or retard) the phase of N-counter 29 but, because the clock for digital phase-locked loop 20 comes from the output of the I/D circuit 28 of digital phase-locked loop 25, N-counter 24 is advanced or retarded by the same amount. The phase error detected by the phase detector 26 of digital phase-locked loop 25 will remain the same, $K_2$-counter 27 continues to integrate this phase error, and the process is repeated resulting in a constant rate being added to the clock of $N_1$-counter 24 and, thereby, to $\phi_{OUT}$. This process continues until $\phi_{IN} = \phi_{OUT}$ and the constant phase rate added to $\phi_{OUT}$ by digital phase-locked loop 25 is equal to the frequency step which was added to the input.

Some applications may require operation over a wider frequency range than is possible with the circuit of FIG. 10. $K_1$ and $K_2$ determine the second-order response of the second-order digital phase locked loop and cannot be changed to increase the frequency range of the second-order digital phase-locked loop. The circuit of FIG. 10 has three variable input parameters (N, $K_1$, and $K_2$) and four output parameters (first-order gain, second-order gain, $(\Delta f_{IN})_{min}$, and $(\Delta f_{IN})_{max}$). All four output parameters cannot be determined independently and fixing any three output parameters determines the fourth.

Figure 11:
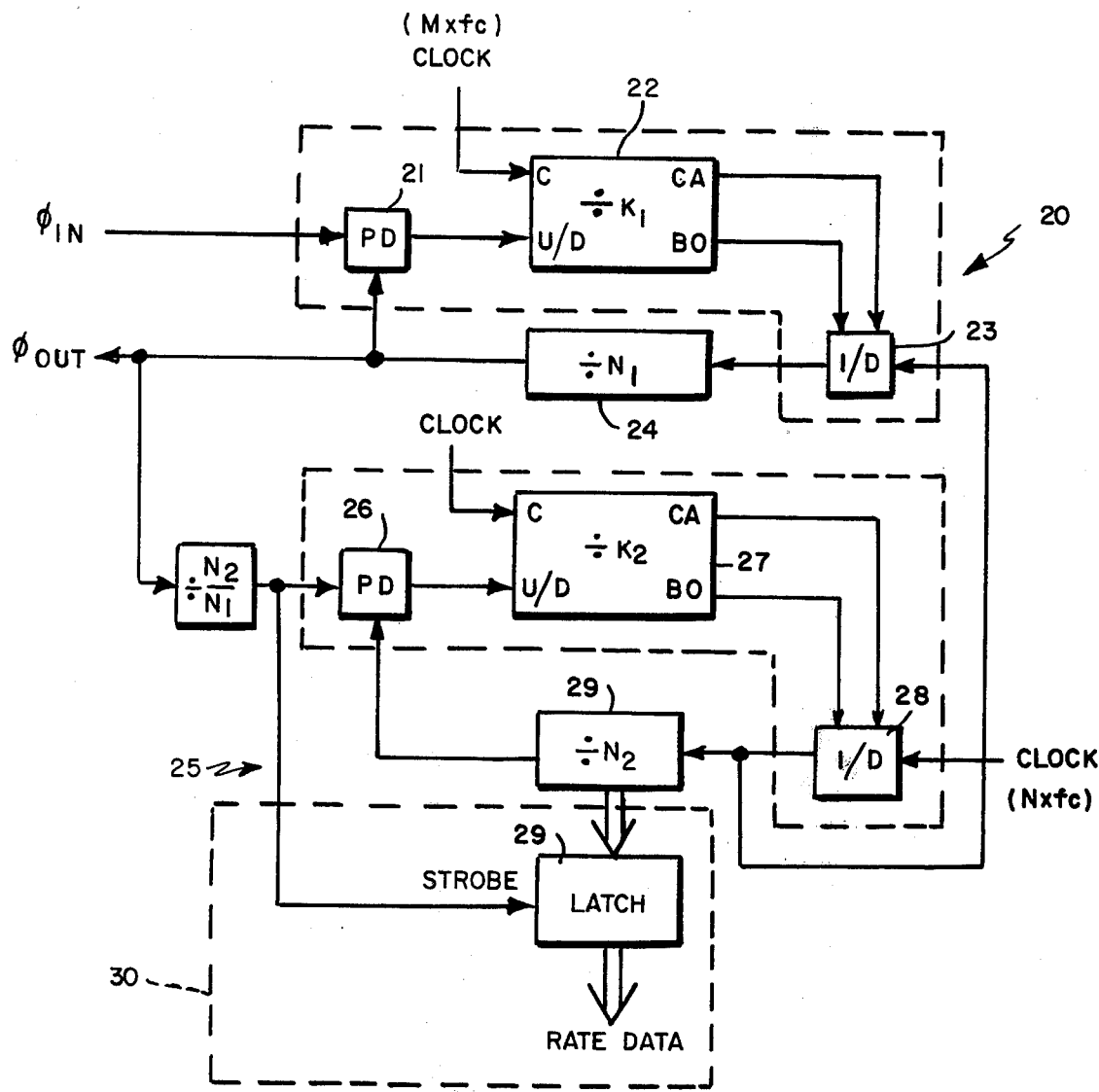
FIG. 11 shows a block diagram of the invention used in the form of a second-order filter for operation over an extended frequency range as compared to that of FIG. 9.

The circuit of FIG. 11 enables a second-order loop to operate over an extended frequency range. Operating digital phase-locked loop 25 at a lower frequency than digital phase-locked loop 20 and dividing the output of digital phase-locked loop 20 down to such lower frequency, allows independent control of both the frequency quantization and the frequency range of the second-order digital phase-locked loop.

The phase data can be read directly by converting the phase information of the output signal to a parallel digital signal at the $\div N_1$ feedback counter 24 to yield a digital representation of the output phase angle. A suitable way for performing such operation is described in U.S. Pat. No. 3,706,902, issued on Dec. 12, 1972 to D. B. Cox, Jr. et al.

Since the phase error between the input and the output of digital phase-locked loop 25 is proportional to the frequency offset, digital rate data can be directly read out from the $N_2$-counter 29 of the second-order digital phase-locked loop. Such read-out requires the addition of a holding register, or latch, 30 as shown in dashed lines in FIG. 11, which register accepts parallel data representing the output of $N_2$-counter 28. Holding register can be appropriately strobed by the output to phase detector 26, as shown, to produce such rate data as required. Appropriate means for performing such operation is also described in detail in the above-identified U.S. Pat. No. 3,706,902.

The transfer function of the second-order system of FIG. 11 can be expressed as $$\frac{\phi_{OUT}}{\phi_{IN}} = \frac{\omega_1(s+\omega_2)}{s^2 + \omega_{1s} + \omega_1\omega_2} \qquad (10)$$

where $$\omega_1 = \frac{(K_{D1})(M)(f_c)}{(K_1)(N_1)} \text{ and} \qquad (11)$$

$$\omega_2 = \frac{(K_{D2})(M)(f_c)}{(K_2)(N_2)} \qquad (12)$$

and $K_{D1}$ and $K_{D2}$ are the gains of the phase detectors in loops 20 and 25, respectively.

Figure 12:
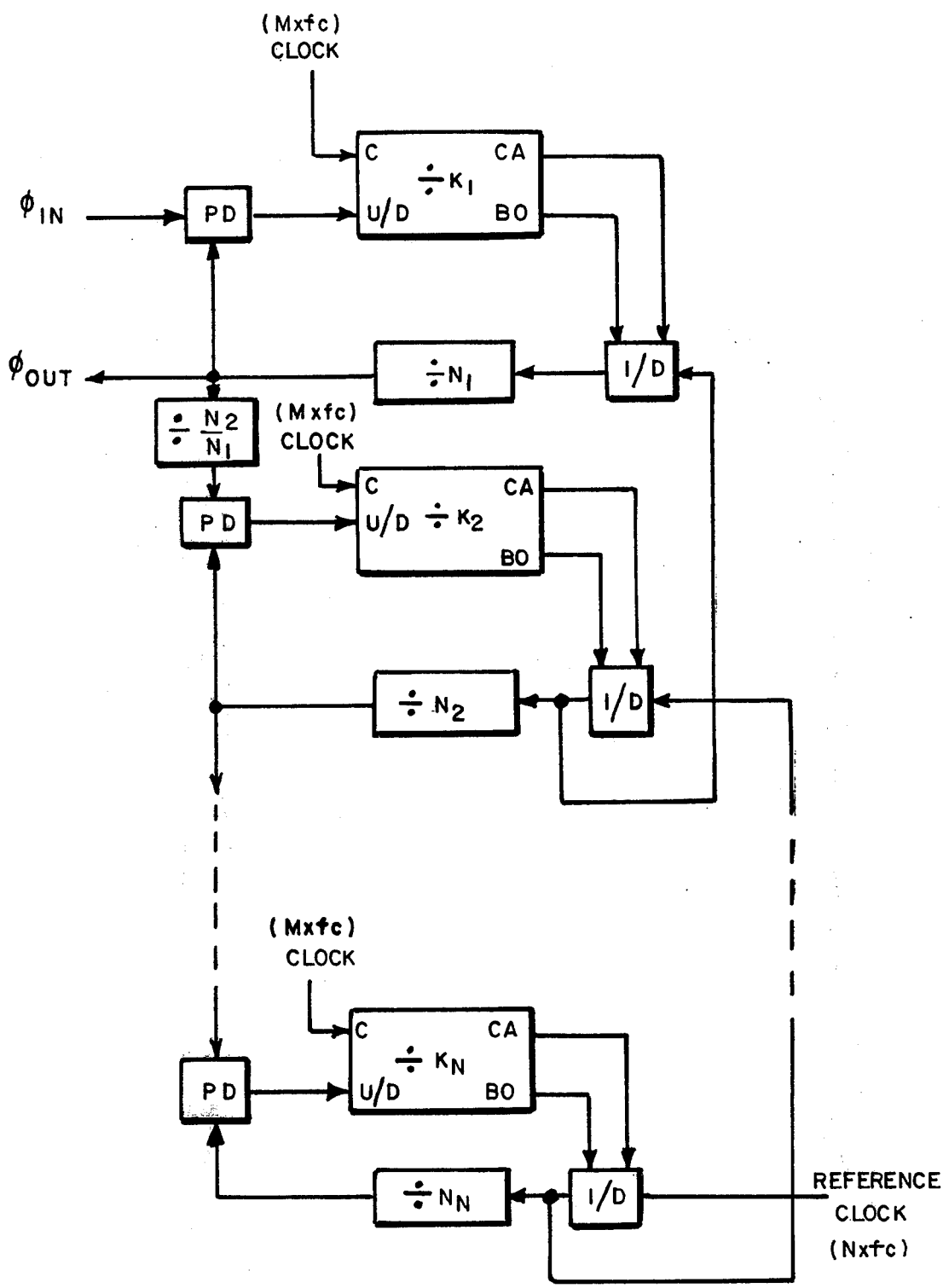
FIG. 12 shows a block diagram of the invention used in the form of a higher order filter.

As can be seen, if $N_1 = N_2$, the configuration of FIG. 11 reduces to that shown in FIG. 10. Further, the configuration of FIG. 11 can be extended to any desired higher order by adding appropriate stages as shown in FIG. 12 for $n$ stages and, hence, and $n^{th}$ order filter. In such case the overall transfer function for an $n^{th}$ order system can be expressed generally as $$\frac{\phi_{OUT}}{\phi_{IN}} = \frac{S^{n-1}\omega_1 + S^{n-2}\omega_1\omega_2 + \ldots + \omega_1\omega_2 \ldots \omega_n}{S^n + S^{n-1}\omega_1 + \omega_1\omega_2 S^{n-2} + \ldots + \omega_1\omega_2 \ldots \omega_n} \qquad (13)$$

where where $$\omega_n = \frac{(K_{DN})(M)(f_c)}{(K_n)(N_n)} \qquad (14)$$

An alternate method of connecting the first-order digital phase-locked loops of FIG. 10 to form a second-order filter is shown by dashed line 105. As seen therein, the dashed line connection is made so that the input to phase detector 26 comes from the input ($\phi_{IN}$) of loop 20 instead of the output ($\phi_{OUT}$) thereof. In this case the connection 106 from the latter point is omitted. The transfer function of the alternate circuit is then $$H(s) = \frac{\phi_{OUT}}{\phi_{IN}} = \omega_1 + \omega_2 \left[ \frac{S + \left(\frac{\omega_1\omega_2}{\omega_1+\omega_2}\right)}{(S+\omega_1)(S+\omega_2)} \right] \qquad (15)$$

where $$\omega_1 = \frac{(K_{D1})(M)(f_c)}{(K_1)(N)} \qquad (16)$$

$$\omega_2 = \frac{(K_{D2})(M)(f_c)}{(K_2)(N)} \qquad (17)$$

In summary, the operation of the digital phase-locked loop of the invention is dependent only upon the clock frequency $f_C$ and a digital input, K. By changing the clock frequency, the center frequency of the loop can be changed and by changing K the loop bandwidth can be changed. Changing the center frequency and bandwidth of the loop does not introduce extraneous transients into the loop response. Both the center frequency and bandwidth can be easily controlled by digital signals without complicated digital to analog conversion.

The digital phase locked loop of the invention can achieve extremely low bandwidths, the only limitation being the stability of the reference oscillator. Similarly, the digital phase-locked loop can accomplish phase tracking with high resolution limited only by the reference oscillator. Where a system requires many separate phase-tracking channels, a system using digital phase-locked loops can be expanded to as many channels as desired simply and inexpensively needing only one precision oscillator.

The digital phase-locked loop of the invention is a simple and reliable digital system, requiring few parts, all widely available. Putting the digital phase-locked loop onto one integrated circuit does not require special processing and the circuit is small enough that it can be economically produced. Being digital, the circuit of the invention is not sensitive to environmental changes and does not require exceptionally rigid regulations of the supply voltage. Once the loop parameters are determined, applying the digital phase-locked loop of the invention in a specific design is simply a matter of supplying the correct digital inputs.

Combining first-order digital phase-locked loop modules produces higher-order digital phase-locked loops, such higher-order loops all having the advantages of first-order loops in the matters of simplicity, digital determination of parameters, insensitivity to environment, etc. Generally, higher-order analog systems are more complex and sensitive to external conditions with increasing order. Higher-order digital phase-locked loops of the invention can perform complex digital filtering with time-varying parameters using very little hardware compared to other methods of digital filtering. For example, in accordance with the invention a fourth-order filter might require only eight integrated circuits if the digital phase-locked loop is made in integrated circuit form.

The invention can replace many other methods of phase and frequency filtering with both economic and performance benefits. Thus, conventional passive and active analog filters provide filtering of a signal but do not interface easily with digital systems. Filters of these types have to be specifically designed for each application. They are extremely susceptible to environmental conditions, especially where high performance is required. Providing variable-bandwidth capability is difficult and frequently results in a tradeoff of other filter parameters.

In some phase-filtering applications the invention can take the place of crystal and ceramic filters, especially in applications where very high Q's are required, or at low frequencies where these types of filters are difficult to produce. Although the performance of crystal and ceramic filters is very good, there are disadvantages associated with their use. Thus, such filters are restricted to a single center-frequency and bandwidth and, generally, a new filter must be specified and ordered for each application. In situations where equipment is to be repaired, keeping a number of different filters on hand may be a problem. Especially at low frequencies such types of filters are susceptible to vibration. Some ceramic filters lose their piezoelectric qualities if raised to too high a temperature. Near their Q and frequency limits, such filters are hard to make and very expensive. Also, for very high-Q applications over a wide temperature range, crystal filters may have to be temperature controlled. Where there are many filters, this is difficult and expensive. Where the filter of the invention can be used, only one accurate frequency reference is required.

Analog phase-locked loops provide analog to digital conversion of the phase information and can be designed with different bandwidths. However, the narrowness of bandwidths achievable with integrated-circuit, analog phase-locked loops is limited by error sources inherent in these circuits. Phase-locked loops made with discrete components can improve upon the performance of integrated-circuit phase-locked loops but only at the cost of size, expense, and design time. Variable bandwidth can be accomplished by analog phase-locked loops, but the range over which the bandwidth can be varied is limited and varying the bandwidth requires extra circuitry which aggravates other problems. Analog phase-locked loops are susceptible to environmental conditions, and their performance goes down as environmental requirements increase. Time constants on the order of a second or longer are not easily achieved by analog phase-locked loops in part because of this sensitivity to short-term environmental changes. The digital phase-locked loop of the invention does not have these problems.

Digital filtering in a computer is not at all comparable with the digital phase locked loop of the invention in cost, size, design and programming time, or complexity. There are many applications where using the digital phase-locked loop of the invention can greatly reduce the load on a computer or eliminate the need to do any filtering at all in the computer.

What is claimed is:

1. A phase processing system comprising at least one phase-locked loop, each said phase-locked loop including
   means responsive to an input signal having a first phase and an output signal having a second phase for producing an error signal representing the magnitude of the phase difference between said first and second phases;
   means responsive to a first clock signal and to said error signal for digitally integrating said error signal to generate first and second control signals as a function of the digitally integrated magnitude of said phase difference;
   means responsive to said first and second control signals and to a second clock signal for controllably changing the number of pulses in said second clock signal in accordance with the generation of one of said first or second control signals to produce an intermediate clock signal having a controlled pulse rate;
   means responsive to said intermediate clock signal for producing said output signal, the phase of which depends on the controlled pulse rate of said intermediate signal.

2. A phase processing system comprising at least one phase-locked loop, each said phase-locked loop including
   means responsive to an input signal having a first phase and an output signal having a second phase for producing an error signal representing the magnitude of the phase difference between said first and second phases;
   means responsive to a first clock signal and to said error signal for digitally integrating said error signal to generate a first control signal whenever the digitally integrated magnitude of said phase difference reaches a first preselected level and to generate a second control signal whenever the digitally integrated magnitude of said phase difference reaches a second preselected level;
   means responsive to said first and second control signals and to a second clock signal for controllably changing the number of pulses in said second clock signal in accordance with the generation of one of said first or second control signals to produce an intermediate clock signal having a controlled pulse rate;
   means responsive to said intermediate clock signal for producing said output signal, the phase of which depends on the controlled pulse rate of said intermediate signal.

3. A system in accordance with claim 2 wherein said error signal digital integrating means comprises an up/down counter means having a counter state which can vary between a modulus value representing said first preselected level and a zero value representing said second preselected level so that when the integrated value of said error signal reaches said first preselected level said counter recycles from said modulus state level to zero and when the integrated value of said error signal reaches said second preselected level said counter recycles from zero to said modulus state level.

4. A system in accordance with claim 1 wherein said output signal producing means comprises means for converting the frequency of said intermediate clock signal to produce an output signal having a frequency substantially equal to the frequency of said input signal.

5. A phase processing system in accordance with claim 3 wherein said pulse changing means comprises means for adding a controlled number of pulses to said second clock signal when said first control signal is generated and for deleting a controlled number of pulses from said second clock signal when said second control signal is generated, whereby the phase of said output signal depends on the controlled number of pulses which have been so added to deleted.

6. A system in accordance with claim 5 wherein said output signal producing means comprises means for converting the frequency of said intermediate clock signal to produce an output signal having a frequency substantially equal to the frequency of said input signal.

7. A system in accordance with claim 5 wherein said error signal producing means, said error signal digital integrating means and said pulse changing means are formed on a single integrated circuit chip.

8. A system in accordance with claim 6 wherein said error signal producing means comprises an edge triggered phase detector circuit.

9. A system in accordance with claim 6 wherein said error signal producing means comprises an exclusive-OR phase detector circuit.

10. A system in accordance with claim 6 and further including means for reducing cyclical phase errors in said output signal.

11. A system in accordance with claim 8 wherein said error signal producing means further includes an exclusive-OR circuit;
said output signal being supplied to one input of said edge-triggered phase detector circuit, to one input of said exclusive-OR circuit and to the up/down input of said up/down counter means;
said input signal being supplied to the other input of said edge-triggered phase detector circuit,
the output signal from said edge-triggered phase detector circuit being supplied to the other input of said exclusive-OR circuit; and
the output of said exclusive-OR circuit, representing said error signal, being supplied to an enable input of said up/down counter means.

12. A system in accordance with claim 9 wherein said output signal and said input signal are supplied to the inputs of said exclusive-OR phase detector circuit; and
the output of said exclusive-OR phase detector circuit is supplied to the enable input of said up/down counter means and the second most significant bit of said divider counter output bits is supplied to the up/down input of said up/down counter means.

13. A system in accordance with claim 2 wherein said error signal digital integrating means comprises
a pair of up-counters, each having the same modulus and being responsive to said first clock signal, one of said up-counters being responsive to said error signal and the other of said up-counters being responsive to the inverted error signal, said one of said up-counters producing said first control signal and said other of said up-counters producing said second control signal.

14. A system in accordance with claim 13 and further including means for dynamically varying the modulus of said pair of up-counters for varying the bandwidth of said loop.

15. A system in accordance with claim 13 wherein said output signal producing means comprises means for converting the frequency of said intermediate clock signal to produce an output signal having a frequency substantially equal to the frequency of said input signal.

16. A phase processing system in accordance with claim 13 wherein said pulse changing means comprises means for adding a controlled number of pulses to said second clock signal when said first control signal is generated and for deleting a controlled number of pulses from said second clock signal when said second control signal is generated, whereby the phase of said output signal depends on the controlled number of pulses which have been so added or deleted.

17. A system in accordance with claim 16 wherein said output signal producing means comprises means for converting the frequency of said intermediate clock signal to produce an output signal having a frequency substantialy equal to the frequency of said input signal.

18. A system in accordance with claim 16 wherein said error signal producing means, said error signal digital integrating means and said pulse changing means are formed on a single integrated circuit chip.

19. A system in accordance with claim 17 wherein said error signal producing means comprises an edge-triggered phase detector circuit.

20. A system in accordance with claim 17 wherein said error signal producing means comprises an exclusive-OR phase detector circuit.

21. A system in accordance with claim 17 and further including means for reducing cyclical phase errors in said output signal.

22. A system in accordance with claim 2 wherein said error signal digital integrating means comprises a pair of up-counters each being responsive to said first clock signal, one of said up-counters having a first modulus for producing said first control signal and the other of said up-counters having a second modulus which is one-half said first modulus, said other of said up-counters being responsive to said error signal for producing said second control signal.

23. A system in accordance with claim 22 wherein said output signal producing means comprises means for converting the frequency of said intermediate clock signal to produce an output signal having a frequency substantially equal to the frequency of said input signal.

24. A phase processing system in accordance with claim 22 wherein said pulse changing means comprises means for adding a controlled number of pulses to said second clock signal when said first control signal is generated and for deleting a controlled number of pulses from said second clock signal when said second control signal is generated, whereby the phase of said output signal depends on the controlled number of pulses which have been so added or deleted.

25. A system in accordance with claim 24 wherein said output signal producing means comprises means for converting the frequency of said intermediate clock signal to produce an output signal having a frequency substantially equal to the frequency of said input signal.

26. A system in accordance with claim 24 wherein said error signal producing means, said error signal digital integrating means and said pulse changing means are formed on a single integrated circuit chip.

27. A system in accordance with claim 25 wherein said error signal producing means comprises an edge-triggered phase detector circuit.

28. A system in accordance with claim 25 wherein said error signal producing means comprises an exclusive-OR phase detector circuit.

29. A system in accordance with claim 25 and further including means for reducing cyclical phase errors in said output signal.

30. A phase processing system in accordance with claim 2 wherein said system comprises a plurality of said phase-locked loops for processing a plurality of input signals having substantially the same bandwidth, the error signal digital integrating means of each said loop including an up-counter having a first modulus and being responsive to said first clock signal and to the error signal of said loop for producing said first control signal for said loop; and a common up-counter having a second modulus which is twice said first modulus and being responsive to said first clock signal for producing a common second control signal for each of said phase-locked loops.

31. A phase processing system in accordance with claim 30 wherein the pulse changing means of each of said loops comprises means for adding a controlled number of pulses to said second clock signal when said first control signal is generated and for deleting a controlled number of pulses from said second clock signal when said second control signal is generated, whereby the phase of said output signal depends on the controlled number of pulses which have been so added or deleted.

32. A phase processing system in accordance with claim 2 and further including means for dynamically varying said first and second preselected levels.

33. A phase processing system in accordance with claim 2 and further including means for reducing cyclical phase errors in said output signal.

34. A system in accordance with claim 2 wherein said error signal producing means, said error signal digital integrating means and said pulse changing means are formed on a single integrated circuit chip.

35. A system in accordance with claim 2 wherein said pulse changing means comprises means for adding a controlled number of pulses to said second clock signal when said first control signal is generated and for deleting a controlled number of pulses from said second clock signal when said second control signal is generated, whereby the phase of said output signal depends on the controlled number of pulses which have been so added or deleted.

36. A device comprising
phase detector means responsive to a first signal having a first phase and to a second signal having a second phase for producing a phase detected output signal representing the magnitude of the phase difference between said first and second phases;
digital integrating means responsive to a first clock signal and to said phase detected output signal for digitally integrating said phase detected output signal to generate a first control signal whenever the digitally integrated magnitude of said phase difference reaches a first preselected level and to generate a second control signal whenever the digitally integrated magnitude of said phase difference reaches a second preselected level; and
means responsive to a second clock signal and to said first and second control signals for producing a controlled clock output signal, the number of pulses of said clock output signal being controlled in accordance with the generation of said first and said second control signals.

37. A device in accordance with claim 36 wherein said phase detector means, said digital integrating means and said controlled clock output signal means are formed on a single integrated circuit chip.

38. A digital phase processing system in accordance with claim 2 wherein
said error signal producing means produces a pulse-width modulated error signal; and
said digital integrating means is a counting means.

39. A system in accordance with claim 35 wherein said pulse changing means includes
a first pulse circuit for providing a first plurality of pulses in response to the rising edges of the pulses of said second clock signal;
a second pulse circuit for providing a second plurality of pulses in response to the falling edges of the pulses of said second clock signal; and
logic means responsive to said first and second pulse circuits for providing a first plurality of pulses when said first and second control signals are not generated, for adding a pulse from said second plurality of pulses to said first plurality of pulses when said first control signal is generated, and for deleting a pulse from said first plurality of pulses when said second control signal is generated.

40. A system in accordance with claim 35 wherein the frequency of said second clock signal is twice the frequency of said first clock signal and further wherein said pulse changing means includes
a pulse circuit responsive to said second clock signal for producing a pulse output signal having a frequency equal to one half the frequency of said second clock signal; and
logic means responsive to said second clock signal and to said pulse output signal and further responsive to said first and second control signals for providing said pulse output signal when said first and second control signals are not generated, for adding a pulse to said pulse output signal when said first control signal is generated, and for deleting a pulse from said pulse output signal when said second control signal is generated.

41. A system in accordance with claim 2 and further including
clock frequency compensation means responsive to a pair of clock correction signals for controllably changing the frequency of said second clock signal being fed to said intermediate clock signal producing means.

42. A system in accordance with claim 41 wherein said clock frequency compensation means includes means for adding a pulse to said second clock signal in response to one of said clock correction signals and for deleting a pulse from said second clock signal in response to the other of said clock correction signals.

43. A phase processing system in accordance with claim 32 wherein said error signal digital integrating means is a counting means and said first and second preselected level varying means includes means for dynamically varying the modulus of said counting means.

44. A phase processing system in accordance with claim 43 wherein said modulus varying means includes means for adding or deleting stages to or from the least-significant-bit end of said counting means.

45. A phase processing system in accordance with claim 33 wherein said error signal digital integrating means comprises
a pair of up-counters, each having the same modulus and being responsive to said first clock signal, one of said up-counters being responsive to said error signal and the other of said up-counters being responsive to the inverted error signal, said one of said up-counters producing said first control signal and said other of said up-counters producing said second control signal.

* * * * *